United States Patent [19]
Ella

[11] Patent Number: 5,714,917
[45] Date of Patent: Feb. 3, 1998

[54] DEVICE INCORPORATING A TUNABLE THIN FILM BULK ACOUSTIC RESONATOR FOR PERFORMING AMPLITUDE AND PHASE MODULATION

[75] Inventor: Juha Ella, Salo, Finland

[73] Assignee: Nokia Mobile Phones Limited, Finland

[21] Appl. No.: 720,696

[22] Filed: Oct. 2, 1996

[51] Int. Cl.⁶ .............................. H03C 1/00; H03C 3/00; H01L 41/047; H01L 41/053
[52] U.S. Cl. .................... 332/144; 332/149; 310/318; 310/348; 310/365; 333/188; 330/5.5
[58] Field of Search .................... 332/144, 146, 332/149, 174–176; 310/318, 345, 348, 349, 350, 365; 330/5, 5.5; 333/24 R, 147, 188

[56] References Cited

U.S. PATENT DOCUMENTS

| | | | |
|---|---|---|---|
| 3,173,100 | 3/1965 | White | 330/5.5 |
| 3,293,557 | 12/1966 | Denton | 330/5.5 X |
| 3,686,579 | 8/1972 | Everett | 330/5.5 |
| 3,696,312 | 10/1972 | Kuhn et al. | 332/144 X |
| 3,764,928 | 10/1973 | Gires et al. | 330/5.5 |
| 4,365,216 | 12/1982 | Minagawa et al. | 333/153 |
| 5,153,476 | 10/1992 | Kosinski | 310/313 R |
| 5,166,646 | 11/1992 | Avanic et al. | 331/107 A |
| 5,185,589 | 2/1993 | Krishnaswamy et al. | 333/133 |
| 5,233,259 | 8/1993 | Krishnaswamy et al. | 310/324 |
| 5,446,306 | 8/1995 | Stokes et al. | 257/416 |

OTHER PUBLICATIONS

"Acoustic Bulk Wave Composite Resonators", K. Lakin, Appl. Phys. Lett. 38(3), 1 Feb.1981, pp.125–127.
"Systematic Design of Stacked–Crystal Filters by Microwave Network Methods", A. Ballato, IEEE Trans. of Microwave Theory and Techniques, vol., MTT–22, No. 1, Jan.1974, pp. 14–25.
"Multi–Layered Ultrasonic Transducers Empolying Air–Gap Structure", S. Yoshimoto, IEEE Trans. of Ultrasonic. . . vol. 42, No. 3, May. 1995, pp. 339–343.
"Design of Unapodized Surface–Wave Transducers with Spectral Weighting", G. Nudd IEEE Trans. on Microwave Theory and Techniques, vol. MTT–22 No. 1, Jan. 1974, pp. 14–23.

(List continued on next page.)

*Primary Examiner*—David Mis
*Attorney, Agent, or Firm*—Perman & Green, LLP

[57] ABSTRACT

A method for amplitude modulating signals, and a circuit that operates in accordance with the method. The method includes a first step of applying a modulating low frequency signal having a time-varying voltage to a tunable resonator. The tunable resonator exhibits parallel and series resonances at frequencies which shift as a function of the time-varying voltage. A second step includes applying an RF carrier signal having a frequency that is between the parallel resonant frequency and the series resonant frequency to the tunable resonator. In response thereto, the tunable resonator causes the RF carrier signal to be attenuated as a function of the time-varying voltage of the modulating low frequency signal. Also provided is a method for phase modulating signals, and a circuit that operates in accordance therewith. A first step includes applying a modulating low frequency signal having a time-varying voltage to a tunable resonator. The tunable resonator yields a maximum phase shift at one of a parallel resonant frequency and a series resonant frequency in response to the modulating low frequency signal. The amount of phase shift yielded is a function of a variation of the modulating low frequency signal voltage. A further step includes applying an RF carrier signal having a frequency that is substantially equal to the one of a parallel resonant frequency and a series resonant frequency. In response thereto, the tunable resonator phase shifts the RF carrier signal by the amount of phase shift yielded by the tunable resonator.

15 Claims, 20 Drawing Sheets

OTHER PUBLICATIONS

"Development of Miniature Filters for Wireless Applications", K. Lakin et al., IEEE MTT–S Digest, 1995, pp. 883–886.

"Temperature Compensated High Couplijng and High . . . Substrates", T. Shiosaki et al., Ultrasonic Symposium, 1984, pp. 405–410.

"An Air–Gap Type Piezoelectric Composite Thin Film Resonator", H. Satoh et al., IEEE, 1985, pp.361–366.

"Coplanar Waveguides and Microwave Inductors on Silicon Substrates", A. Reyes, IEEE, 1995, pp. 2016–2021.

"Ultrasonic in Integrated Electronics", W. Newell, Proceedings of the IEEE, pp. 1305–1309.

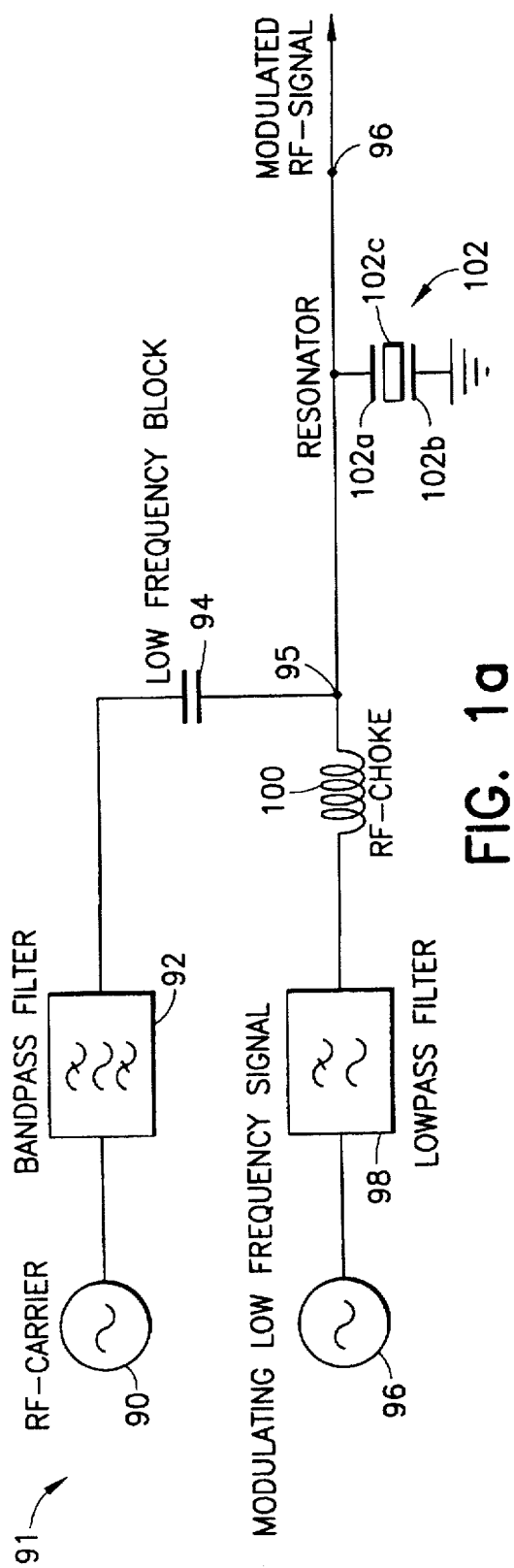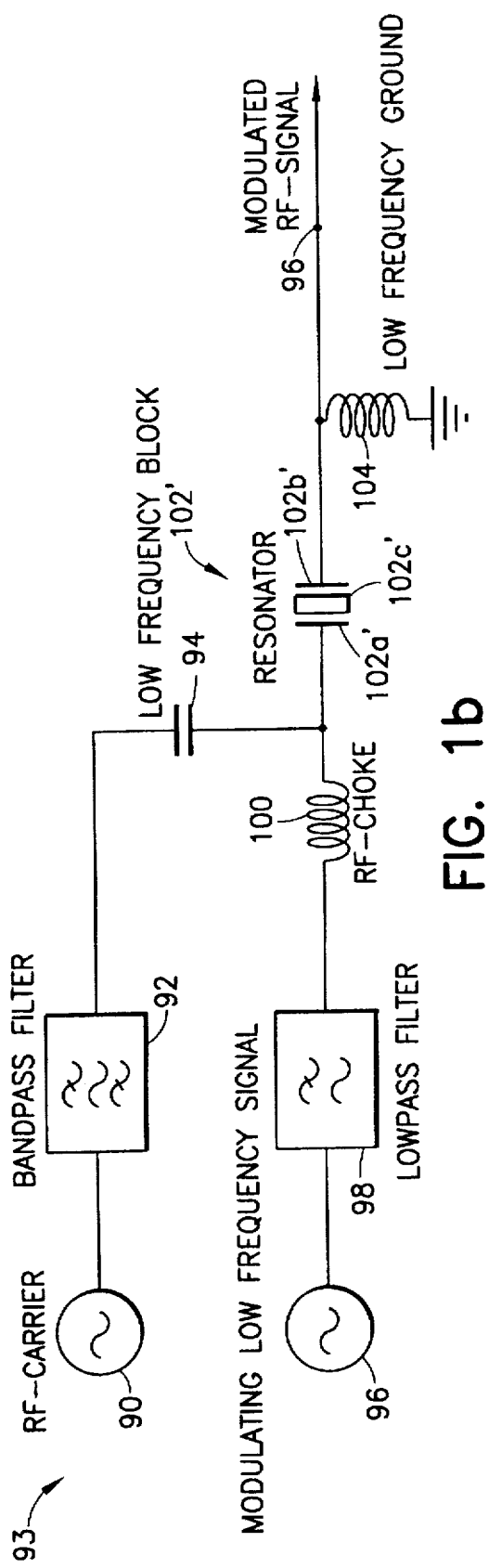

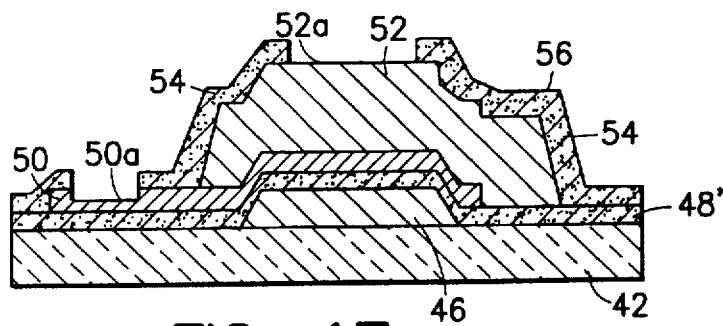
FIG. 17a
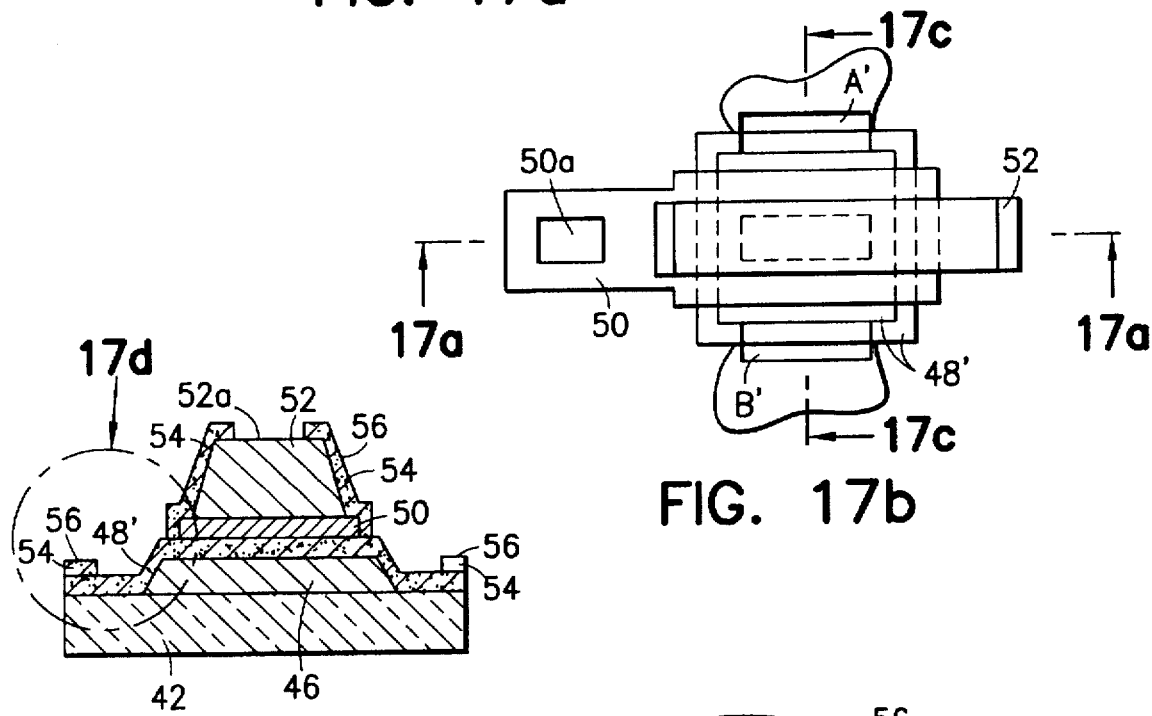
FIG. 17b
FIG. 17c
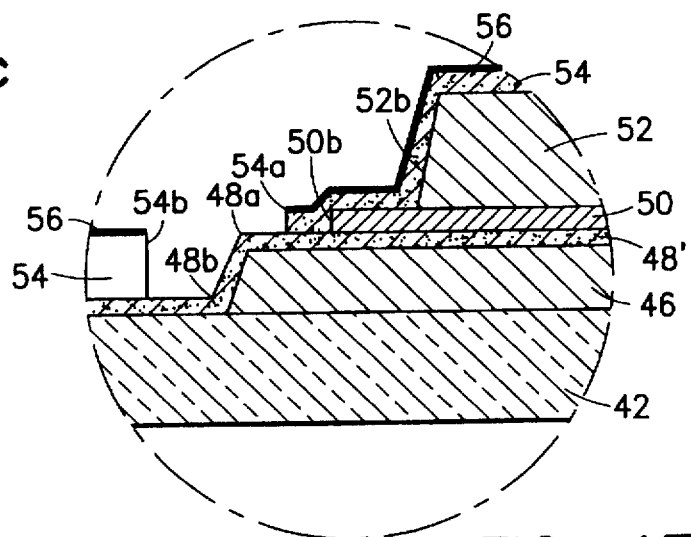
FIG. 17d

| WAFER | ZnO CUSHION THICKNESS (APPROXIMATIVE, n=2) |
|---|---|
| Z11 | 940 nm |
| Z12 | 970 |
| Z13 | 1470 |
| Z14 | 710 |
| Z15 | 845 |

FIG. 22

| WAFER | THICKNESS |
|---|---|
| Z11 | 240 nm |
| Z12 | 250 |
| Z13 | 260 |
| Z14 | 270 |
| Z15 | 280 |

FIG. 23

DEVICE INCORPORATING A TUNABLE THIN FILM BULK ACOUSTIC RESONATOR FOR PERFORMING AMPLITUDE AND PHASE MODULATION

FIELD OF THE INVENTION

The present invention relates to bulk acoustic resonators and, in particular, the invention relates to bulk acoustic resonators for amplitude modulating and phase modulating signals.

BACKGROUND OF THE INVENTION

It is known in the art to provide tunable Bulk Acoustic resonators. U.S. Pat. No. 5,446,306, issued to Stokes et al., discloses a Thin Film Voltage-Tuned Semiconductor Bulk Acoustic Resonator. This device comprises a piezoelectric film positioned between a first and a second electrode. The second electrode is positioned adjacent to a substrate containing a via hole. In response to a variable voltage source applying a DC bias voltage to the electrodes, an electric field is created between the electrodes within the piezoelectric film. As a result, the piezoelectric film vibrates at a frequency that is different than its unbiased resonant frequency. The resonant frequency of the SBAR can be varied by adjusting the DC bias voltage.

U.S. Pat. No. 5,153,476, issued to Kosinski, discloses biasing electrodes on a piezoelectric acoustic vibrator for altering the sensitivity of the acoustic vibrator and compensating for acoustic stresses applied to the acoustic vibrator. The biasing electrodes can be energized by a static DC voltage source, or can be used in a dynamic biasing arrangement to provide instantaneous compensation for changing environmental conditions.

U.S. Pat. No. 5,166,646, issued to Avanic et al., discloses an integrated tunable resonator including a common semiconductor carrier upon which is formed an integrated voltage variable capacitor. A bulk acoustic wave resonator is formed on the common semiconductor carrier and is coupled to the voltage variable capacitor. A thin film resonator is coupled to the voltage variable capacitor, both of which are formed on a common semiconductor substrate. These three elements provide a tunable integrated resonator.

Another disclosure which may be relevant to the invention is an article entitled "Multi-Layered Ultrasonic Transducers Employing an Air Gap", IEEE Transactions on Ultrasonics, Ferroelectrics, and Frequency Control, Vol. 42, No. 3, May 1995, by Susumu Yoshimoto, Masamichi Sakamoto, Ken-Ya Hashimoto and Masatsune Yamaguchi. The article discloses a multilayered ultrasonic transducer having an air gap.

Although tunable resonators are known in the art, the inventor is unaware of any Bulk Acoustic Wave (BAW) resonator for performing amplitude modulation and phase modulation of carrier signals.

OBJECTS OF THE INVENTION

It is a first object of this invention to provide a device incorporating a tunable Bulk Acoustic Wave (BAW) resonator for amplitude modulating a signal of interest.

It is a second object of this invention to provide a device incorporating a tunable Bulk Acoustic Wave (BAW) resonator for phase modulating a signal of interest.

Further objects and advantages of this invention will become apparent from a consideration of the drawings and ensuing description.

SUMMARY OF THE INVENTION

The foregoing and other problems are overcome and the objects of the invention are realized by a device incorporating a tunable Bulk Acoustic Wave (BAW) resonator (also referred to as a "Thin Film Bulk Acoustic Resonator (FBAR)") for amplitude modulating and phase modulating carrier signals in response to an application of a modulating low frequency signal to the BAW resonator.

According to one aspect of the invention, a BAW resonator is provided which comprises a piezoelectric layer, a first and a second protective layer, a first electrode, a second electrode, a bridge (also referred to as a "membrane"), a pair of etch windows, an air gap, and a substrate. A portion of the piezoelectric layer is positioned atop the first electrode, and the second electrode is positioned atop the piezoelectric layer, thereby forming a parallel plate structure between which the piezoelectric layer is allowed to resonate or vibrate. The piezoelectric layer comprises, by example, zinc-oxide (ZnO), and has a thickness of 1.7 µm. The electrodes comprise, by example, gold (Au) and have thicknesses of 0.1 µm.

In a preferred embodiment of the invention, the membrane comprises two layers, namely a top layer and a bottom layer. The top layer, which preferably has a thickness of 0.6 µm and comprises poly-silicon, has a top surface which is in contact with the first electrode and portions of the piezoelectric layer. The top layer is situated atop a portion of the bottom layer, which preferably has a thickness of 0.4 µm and is comprised of silicon-dioxide ($SiO_2$).

A portion of a bottom surface of the membrane is situated adjacent to the air gap, which separates this portion of the membrane's bottom surface from a portion of the substrate. The air gap is formed by etching a portion of the substrate. The air gap is bounded by the etch windows, by a portion of the first protective layer, by the bottom surface portion of the membrane, and by inner faces of the substrate. The air gap functions to isolate acoustic vibrations created by the piezoelectric layer from the substrate.

The first protective layer, which has a thickness of 0.4 µm and comprises $SiO_2$, covers a top face of the substrate and portions of the air gap. The second protective layer covers the first protective layer, portions of the membrane, portions of the piezoelectric layer, and portions of the top electrode. The etch windows and portions of the first and second electrodes are exposed to the air. The second protective layer preferably has a thickness of 0.2 µm and comprises $SiO_2$.

The etch windows are formed within the first and second protective layers on opposite sides of the membrane from one another. Through the etch windows, material is etched from the substrate to form the air gap, after the membrane has been formed on the substrate.

In accordance with another aspect of the invention, the air gap may be created by using a sacrificial layer instead of by etching the substrate. For example, during fabrication of the resonator, a sacrificial layer is deposited over the substrate prior to the deposition of the layers forming the membrane. Then, after all layers of the resonator have been formed, the sacrificial layer may be removed through the etch windows to form the air gap. In this manner, no etching of the substrate needs to be done to create the air gap.

In another embodiment of the invention, a BAW resonator is provided which is similar to the BAW resonator of the previous embodiment, except that only one protective layer is provided, and the membrane and the air gap are replaced with an acoustic mirror.

According to another aspect of the invention, a BAW resonator is provided which comprises a piezoelectric layer, a top electrode, a bottom electrode, a membrane, and a substrate having a via. The membrane is formed as part of the substrate located adjacent to the via.

In accordance with another aspect of the invention, a method for fabricating a Bulk Acoustic Wave (BAW) resonator is provided. The method comprises the steps of: (A) forming a zinc-oxide (ZnO) layer on a selected portion of a substrate; (B) forming a first layer of $SiO_2$ on a selected portion of the layer formed by step A; (C) forming a second layer of $SiO_2$ on a selected portion of the layer formed by step B and on selected portions of the substrate; (D) forming a bottom electrode layer on a selected portion of the layer formed by step C; (E) forming a piezoelectric layer on selected portions of the layers formed in steps C and D; (F) depositing $SiO_2$ over selected portions of the layers formed by steps C, D and E; (G) depositing aluminum nitride (AlN) over the $SiO_2$ deposited by step F; (H) patterning the $SiO_2$ and the AlN deposited by steps F and G to form a third layer of $SiO_2$ and a layer of AlN, respectively; (H) forming a top electrode layer on selected portions of the layer of AlN and on a selected portion of the piezoelectric layer formed by step E; and (H) removing the ZnO layer formed by STEP A to form an air gap.

In accordance with a further aspect of the invention, circuits for amplitude modulating and phase modulating RF carrier signals are provided. A first circuit includes a BAW resonator connected in parallel with two circuit branches. A first one of the branches comprises a first generator for generating an RF carrier signal, a bandpass or highpass filter (which could be only a low frequency blocking capacitor). The second branch comprises a second generator for generating a modulating signal, a low pass filter, (which could be only a RF-choke) resonator has parallel and series resonances which shift in frequency in response to an applied low frequency signal.

In an exemplary application in which the circuit is being employed to amplitude modulate an RF signal, the circuit operates as follows. The generator generates an RF carrier signal having a frequency that is preferably within a frequency range in which the resonator exhibits a minimal phase shift response. After the RF carrier signal is generated, it is filtered by the bandpass filter, and is then applied to a low frequency blocking capacitor, which blocks any attendant DC signals.

The second generator, which is a variable voltage source, generates a low frequency, DC modulating signal having a voltage which varies over time. This signal is then filtered by the lowpass filter, and is thereafter applied to an RF-choke which blocks any attendant RF signals. The RF-choke then provides the low frequency signal to the remaining portion of the circuit comprising the resonator.

As the low frequency signal traverses the remaining portion of the circuit, the resonator has a time-varying voltage applied across its electrodes as a result of the signal. The voltage creates a varying electric field within a piezoelectric material located between the electrodes. The electric field causes the piezoelectric material to compress or expand depending on the polarity of the voltage, causing a time-varying frequency shift of the series and parallel resonant frequencies and of the impedance exhibited by the resonator. The shifts cause the strength of the RF carrier signal to be attenuated by varying amounts over time (i.e., the signal experiences a time-dependent changing insertion loss), resulting in an amplitude modulation of the carrier signal.

A second circuit comprises similar elements to those of the first circuit, except that the resonator is series-connected within the circuit, and an additional coil (e.g., an RF-choke which provides grounding for the low frequency signal) is included within the circuit. The second circuit also amplitude modulates signals.

The first and second circuits may also be employed to phase modulate carrier signals. For this application, the circuits operate in a manner similar to that for the amplitude modulation application. However, for the first circuit, the RF carrier is generated to have a frequency which is preferably approximately equal to the parallel resonant frequency of the parallel-connected resonator. This frequency is one at which the resonator yields its maximum phase shift response as a result of the effect of the modulating low frequency signal on the resonator. As such, an application of the carrier signal to the resonator causes a phase shift to occur to the signal. Similarly, for the second circuit, wherein the resonator is connected in series, an RF signal is generated which has a frequency that is approximately equal to the series resonant frequency of the resonator. This is the frequency of which the resonator yields a maximum phase shift in response to the modulating low frequency signal. In this manner an application of the RF carrier signal to the resonator of causes a phase shift to occur to the carrier signal.

BRIEF DESCRIPTION OF THE DRAWINGS

The above set forth and other features of the invention are made more apparent in the ensuing Detailed Description of the Invention when read in conjunction with the attached Drawings, wherein:

FIG. 1a illustrates a circuit incorporating a parallel-connected Bulk Acoustic Wave (BAW) resonator for amplitude modulating and phase modulating signals.

FIG. 1b illustrates a circuit including a series-connected BAW resonator for amplitude modulating and phase modulating signals.

FIG. 2b illustrates a top view of the BAW resonator of FIG. 2a.

FIG. 15b illustrates a cross-section A—A of the BAW resonator of FIG. 15a as it appears after a further step of the fabrication process of FIG. 15a.

FIG. 16b illustrates a top view of the BAW resonator of FIG. 16a.

FIG. 16c illustrates a cross-section B—B of the BAW resonator of FIG. 16a.

FIG. 17a illustrates a cross-section A—A of the BAW resonator of FIG. 16a as it appears after a further step of the fabrication process of the invention.

FIG. 17b illustrates a top view of the BAW resonator of FIG. 17a.

FIG. 17c illustrates a cross section B—B of the BAW resonator of FIG. 17a.

FIG. 17d illustrates a detail of a portion of the BAW resonator of FIG. 17c.

FIG. 18b illustrates top view of the BAW resonator of FIG. 18a.

FIG. 18c illustrates a cross-section B—B of the BAW resonator of FIG. 18a.

FIG. 19b illustrates a top view of the BAW resonator of FIG. 19a.

FIG. 19c illustrates a cross-section B—B of the BAW resonator of FIG. 19a.

FIG. 22 illustrates a table showing various thicknesses of a layer formed over various types of wafers in accordance with the fabrication process of the invention.

FIG. 23 illustrates a table showing various thicknesses of a tuning layer which may be formed in accordance with the fabrication process of the invention, wherein the thicknesses are shown to correspond to various types of wafers.

DETAILED DESCRIPTION OF THE INVENTION

Figure 2A:
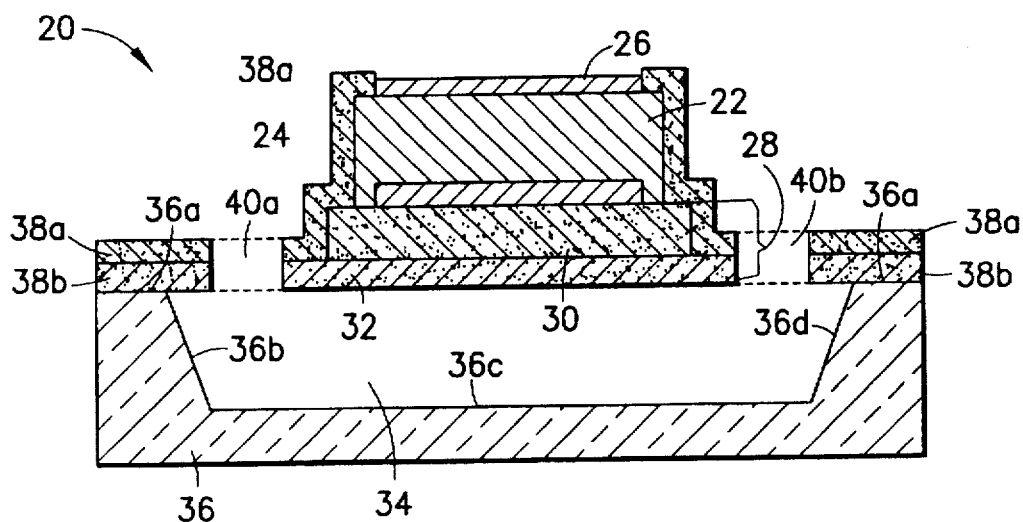
FIG. 2a illustrates a cross-section A—A of a BAW resonator that is constructed in accordance with one embodiment of the invention, wherein the BAW resonator incorporates a membrane and an air gap.
Figure 2B:
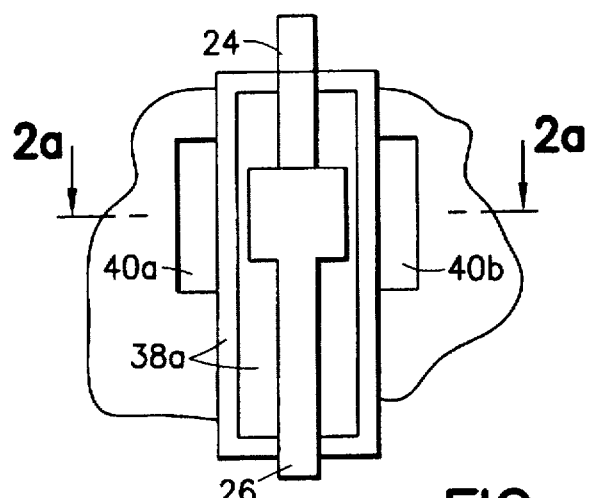

FIGS. 2a and 2b illustrate a cross-section A—A (side view) and a top view, respectively, of a Thin Film Bulk Acoustic Wave Resonator (hereinafter referred to as a "BAW resonator" or as an "FBAR") 20 that is constructed in accordance with one embodiment of the invention. The BAW resonator 20 comprises a piezoelectric layer 22, a first protective layer 38b, a second protective layer 38a, a first electrode 24, a second electrode 26, a membrane 28, etch windows 40a and 40b, an air gap 34, and a substrate 36. A portion of the piezoelectric layer 22 is situated atop the first electrode 24, and the second electrode 26 is situated atop a portion of the piezoelectric layer 22. In this manner, the electrodes 24 and 26 form a parallel plate structure between which the piezoelectric layer 22 is allowed to resonate or vibrate.

The piezoelectric layer 22 may be comprised of any piezoelectric material that can be fabricated as a thin film such as, by example, zinc-oxide (ZnO), or aluminum-nitride (AlN). In a preferred embodiment of the invention, the piezoelectric layer 22 has a thickness of approximately 1.7 µm.

The first and second electrodes 24 and 26 may be comprised of any type of conductive material such as, by example, gold (Au). Each of the first and second electrodes 24 and 26 is preferably 0.1 µm thick.

The membrane (also referred to as a "bridge" or as a "supporting layer") 28 may comprise one or more layers. In a preferred embodiment of the invention, the membrane 28 comprises two layers, a top layer 30 which is approximately 0.6 µm thick, and a bottom layer 32 which is approximately 0.4 µm thick. The top layer 30, which has a top surface in contact with the first electrode 24 and with portions of the piezoelectric layer 22, as is illustrated in FIG. 2a, is situated atop the bottom layer 32. The top layer 30 is preferably comprised of poly-silicon (poly-si) or aluminum-nitride (AlN), and the bottom layer 32 is preferably comprised of silicon-dioxide (SiO$_2$) or gallium arsenide (GaAs). However, these layers may be comprised of any other suitable materials.

A portion of a bottom surface of the membrane 28 is situated adjacent to the air gap 34, which is formed within a portion of the substrate 36. The air gap 34 separates the bottom surface portion of the membrane 28 from a portion of the substrate 36. The air gap 34 is bounded by the etch windows 40a and 40b (to be described below), by a portion of the first protective layer 38b (to be described below), by a bottom surface of the membrane 28, and by inner faces 36b, 36c, and 36d of the substrate 36. The air gap 34 functions to acoustically isolate vibrations produced by the piezoelectric layer 22 from the substrate 36. The substrate 36 may be comprised of any suitable materials such as, by example, silicon (Si), SiO$_2$, GaAs, or glass.

The first protective layer 38b covers a top face 36a of the substrate 36 and portions of the air gap 34. A second protective layer 38a covers: (1) the first protective layer 38b, (2) portions of the membrane 28, (3) portions of the piezoelectric layer 22, and (4) portions of the top electrode 26, as can be appreciated in view of FIGS. 2a and 2b. The etch windows 40a and 40b and portions of the first and second electrodes 24 and 26 are exposed to air. Preferably, the first protective layer 38b is comprised of $SiO_2$ and has a thickness of 0.4 μm, and the second protective layer 38a is comprised of $SiO_2$ and has a thickness of 0.2 μm.

As can be appreciated in view of FIGS. 2a and 2b, the etch windows 40a and 40b are formed within the first and second protective layers 38a and 38b on opposite sides of the membrane 28 from one another. The etch windows 40a and 40b are created during the fabrication of the resonator 20. Through the etch windows 40a and 40b, a portion of the substrate 36 is etched to form the air gap 34 after the membrane layers have been deposited over the substrate 22.

Figure 20:
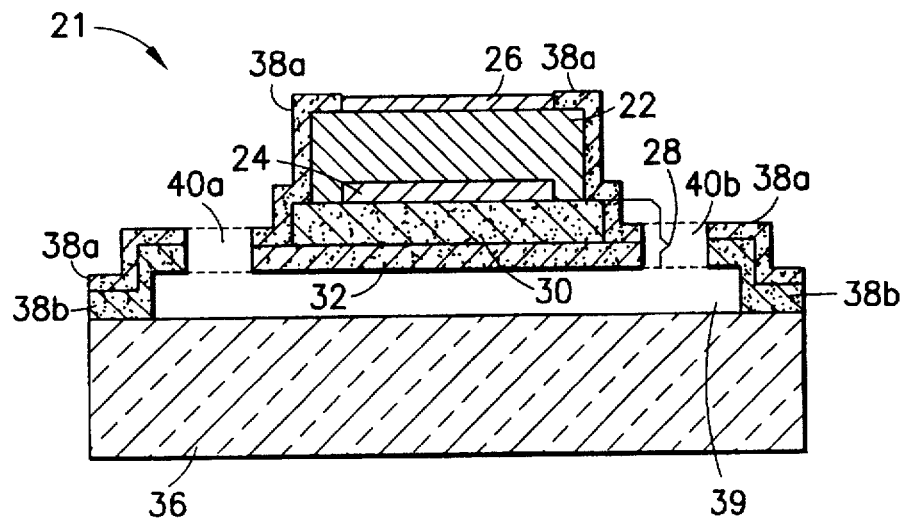
FIG. 20 illustrates a cross-section of a BAW resonator that is constructed in accordance with an embodiment of the invention incorporating a sacrificial layer.

In accordance with another aspect of the invention, the air gap 62 may be created by using a sacrificial layer 39 instead of by etching the substrate 36. Referring to FIG. 20, for example, a BAW resonator 21 similar to the one illustrated in FIG. 2a is shown, with an addition of the sacrificial layer 39. During fabrications of the resonator 21, the sacrificial layer 39 is deposited over the substrate 36 prior to the deposition of the membrane 28. After all layers of the resonator 21 have been formed, the sacrificial layer 39 is removed through the etch windows 40a and 40b to form the air gap 34. In this manner, no etching of the substrate needs to be done to create the air gap 34. Accordingly, substrates may be employed which comprise various types of materials including, by example, $SiO_2$, GaAs, glass, and ceramic materials.

For each of the resonators 20, and 21, when a voltage is applied across the first and second electrodes 24 and 26, an electric field is created between these electrodes 24 and 26 causing the piezoelectric layer 22 to vibrate. The acoustic vibrations produced by the piezoelectric layer 22 propagate from the vibrating piezoelectric layer 22 through the membrane layers 30 and 32. Vibrations reaching the interface between the membrane 28 and the air gap 34 are reflected by this interface back into the membrane 28. In this manner, the air gap 34 isolates vibrations produced by the piezoelectric layer 22 from the substrate.

Figure 21:
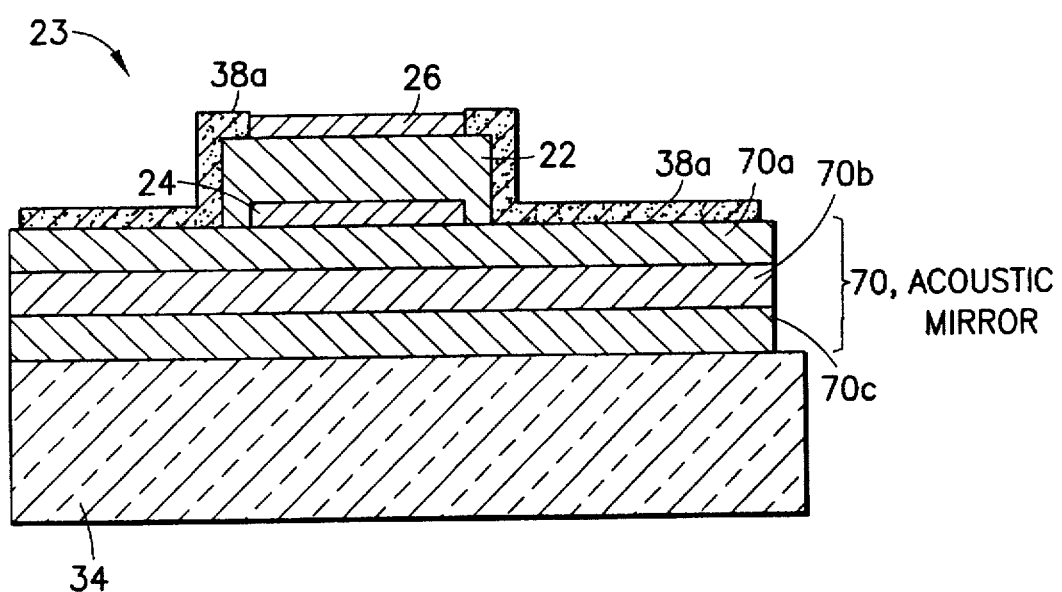
FIG. 21 illustrates a BAW resonator that is constructed in accordance with an embodiment of the invention incorporating an acoustic mirror.

In another embodiment of the invention, which is illustrated in FIG. 21, a BAW resonator 23 is shown. This resonator 23 has a similar structure as that of the previous embodiment, except that only a single protective layer 38a is provided, and the membrane 28 and the air gap 34 are replaced with an acoustic mirror 70 which acoustically isolates vibrations produced by the piezoelectric layer 22 from the substrate 36. This resonator 23 is also referred to a "Solidly Mounted Resonator ("SMR")."

The protective layer 38a comprises, by example, $SiO_2$ of a thickness of 0.2 μm. The acoustic mirror 70 may comprise one or more layers. In a preferred embodiment of the invention, the acoustic mirror 70 comprises three layers, namely a top layer 70a, a middle layer 70b, and a bottom layer 70c, although additional layers may be employed. Each layer 70a, 70b and 70c has a thickness that is, by example, approximately equal to one quarter wavelength. In a preferred embodiment of the invention, the top layer 70a and bottom layer 70c are comprised of materials having low acoustic impedances such as, by example, silicon (Si), poly-silicon, aluminum (Al), or a polymer. Also in the preferred embodiment of the invention, the middle layer 70b is comprised of a material having a high acoustic impedance such as, by example, Gold (Au), Molybdenum (Mo), or tungsten (W). As such, the acoustic impedance of the middle layer 70b is greater than the acoustic impedance of the top layer 70a. Similarly, the acoustic impedance of the middle layer 70b is greater than the acoustic impedance of the bottom layer 70c. When the piezoelectric layer 22 vibrates, the vibrations it produces are substantially isolated from the substrate 34 by the layers 70a, 70b and 70c. Being that the vibrations are isolated in this manner, the substrate 34 may be comprised of a material having a low impedance such as, by example, Si, $SiO_2$, GaAs, glass or a ceramic material.

The BAW resonator 20 is structurally rugged, permitting high production yields and easier packaging. In addition, the resonator has a small size, thereby permitting compact resonator layouts on wafers.

Figure 3:
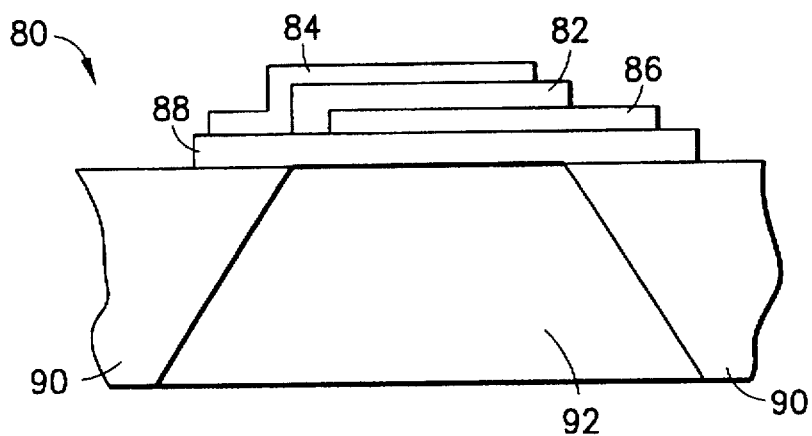
FIG. 3 illustrates a BAW resonator that is constructed in accordance with an embodiment of the invention incorporating a substrate via hole.
Figure 4:
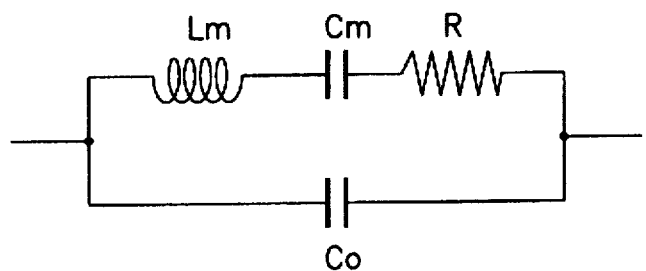
FIG. 4 illustrates an equivalent circuit of the resonator of FIG. 3.

In a further embodiment of the invention, a resonator 80 is provided. A cross-section of this resonator 80 is shown in FIG. 3. The resonator 80 comprises a piezoelectric layer 82, which is situated between a portion of a top electrode 84 and a portion of a bottom electrode 86. The resonator 80 also comprises a membrane 88, and a substrate 90 having a via 92. The membrane 88 has a top surface that is positioned adjacent to: (1) a bottom surface of the bottom electrode 86, (2) a portion of a bottom surface of the piezoelectric layer 82, and (3) a portion of a bottom surface of the top electrode 84. A bottom surface of the membrane 88 is positioned adjacent to a top surface of the substrate 90 and to a portion of the via 92 formed within the substrate 90. An equivalent circuit of the resonator 80 is illustrated in FIG. 4

The resonator 80 functions in a similar manner to the resonator 20 described above in that both of these devices employ air interfaces (i.e., air gap 34 of resonator 20 and via 92 of resonator 80) to reflect acoustic vibrations produced by the respective piezoelectric layers 22 and 82. A primary difference between these resonators 20 and 80, however, is the method employed for fabricating the respective air interfaces. For example, during the fabrication process of resonator 80, after materials are deposited forming each of the top electrode 84, the bottom electrode 86, the piezoelectric layer 82, and the membrane 88, a portion of the substrate is then etched away from underneath the substrate 90 to form via 92.

The membrane 88 may be comprised of, by example, poly-Si or $SiO_2$. The piezoelectric layer 82, the electrodes 84 and 86, and the substrate 90 may be comprised of materials that are similar to those of the same respective components of resonator 20. The size of the via 92 depends upon the area of the resonator 80 and the thickness of the substrate 90. By example, for a case in which the resonator 80 has an area of 200 μm×200 μm, and wherein substrate 90 is comprised of Si with a thickness of 500 μm, the via 92 area is approximately 900 μm×900 μm.

In accordance with another embodiment of the invention, which is not illustrated, a resonator is provided which has the same elements as resonator 80. For this embodiment of the invention, however, no membrane is provided and, as such, the bottom surface of the bottom electrode, the portion of the bottom surface of the piezoelectric layer, and the portion of the bottom surface of the top electrode are situated directly atop the top surface of the substrate and the portion of the via.

Figure 5:
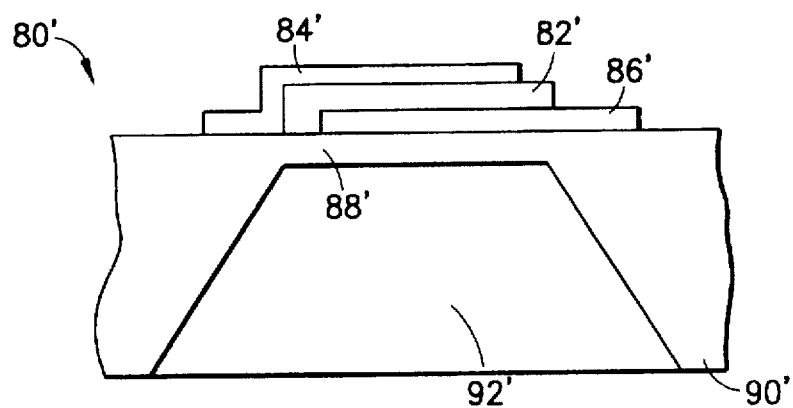
FIG. 5 illustrates a resonator that comprises a via and a membrane that is formed by a portion of a substrate.

FIG. 5 illustrates a further embodiment of the invention wherein a resonator 80' is provided which comprises a top electrode 84', a piezoelectric layer 82', a bottom electrode 86', and a substrate 90' comprising a via 92' and a membrane 88' These elements are positioned relative to one another in a manner that is similar to the same respective elements of resonator 80, except that membrane 88' is formed by a portion of the substrate located underneath a portion of the piezoelectric layer 82' and a portion of the bottom electrode 86'. The membrane 88' is formed by removing a portion of the substrate by, for example, etching substrate material from underneath the substrate 90' in a similar manner to that described above. However, a portion of the substrate 90' which is located adjacent to the portion of the piezoelectric layer 82' and to the portion of the bottom electrode 86' is left unetched during the fabrication process to form the membrane 88'. The resonator 80' functions in a similar manner to the resonator 80 of FIG. 3.

Similar to known types of resonators (e.g., crystal resonators, etc.), each of the resonators of the previously described embodiments exhibits two distinct resonant frequencies, namely a series resonant frequency and a parallel resonant frequency. These resonant frequencies are determined by the thicknesses of the individual layers forming the resonators, as well as by the acoustic impedances of the materials forming these layers. For example, thinner resonators exhibit higher resonant frequencies than those exhibited by thicker resonators.

Also, resonators having layers comprising materials with low acoustic impedances resonate at higher frequencies than resonators comprised of layers having higher acoustic impedances. By example, a resonator having a construction similar to the one shown in FIG. 2a, but having a piezoelectric material 22 comprised of ZnO with a thickness of 2 µm, and a layer 32 comprised of Si that is 0.4 µm thick, resonates at a higher frequency than a resonator comprised of similar materials but having a layer 32 that is comprised of $SiO_2$ having a thickness of 0.4 µm. This is due to the fact that Si has a lower acoustic impedance than $SiO_2$, and thus longitudinal mode acoustic waves travel with greater velocities in Si than in $SiO_2$.

Also, resonators having thinner piezoelectric materials and thicker membranes relative to other resonators have smaller effective coupling coefficients than the other resonators, and have series and parallel resonant frequencies that are closer to one another on the frequency spectrum than those of the other resonators. As such, for an exemplary application wherein one or more of the BAW resonators of the instant invention is employed in a filter application, the filter can exhibit a narrow bandwidth.

Each of the BAW resonators of the invention also has a characteristic acoustic impedance which corresponds to the area of the resonator. By example, resonators having large areas have lower characteristic impedances than those having smaller areas.

Figure 15A:
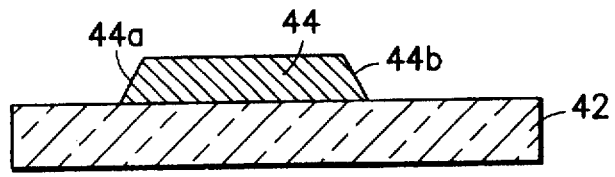
FIG. 15a illustrates a cross section A—A of a BAW resonator as it appears after a first step of a fabrication process performed in accordance with the invention.

Having described a number of aspects of the invention, a further aspect of the invention, namely a process for fabricating a BAW resonator, will now be described. The initial steps of the process can be understood in view of FIGS. 15a–15d, wherein various cross-sections of a substrate 42 and a ZnO layer 44 are shown. In the example shown in FIG. 15a, the substrate 42 is comprised of glass and has a thickness of 100 mm. As a first step of the fabrication process, ZnO is sputtered over the substrate 42. Using a mask layer #1 (not illustrated), the ZnO is then patterned by wet etching to form a "cushion" having a thickness that is, by example, from 800 nm to 1000 nm, depending on the type of wafers used, as is shown in the table of FIG. 22. Thereafter, the ZnO is etched to form gently sloped cushion edges which form sides of the ZnO (cushion edges 44a and 44b are shown). In this manner, a first ZnO layer 44 is formed.

Figure 15B:
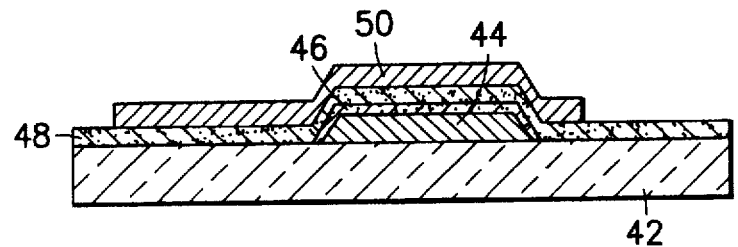
Figure 15C:
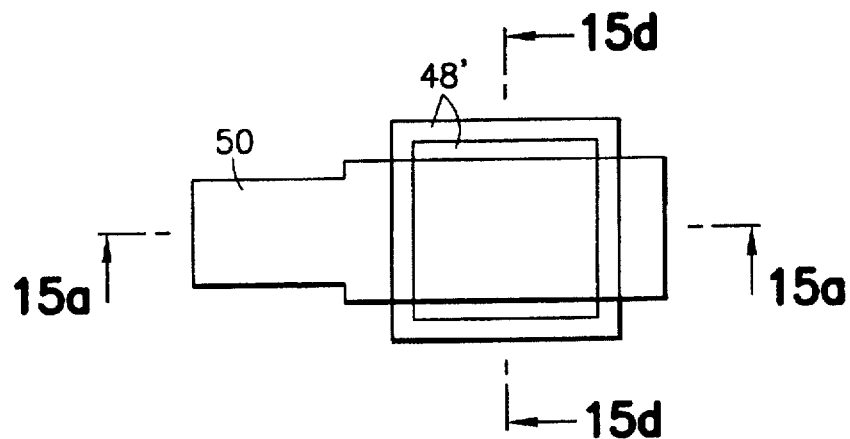
FIG. 15c illustrates a top view of the BAW resonator of FIG. 15b.
Figure 15D:
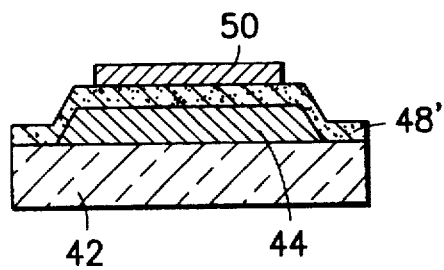
FIG. 15d illustrates a cross-section B—B of the BAW resonator of FIG. 15b.

Next, $SiO_2$ (e.g., PECVD $SiO_2$) is deposited over the first ZnO layer 44. Then, the deposited $SiO_2$ is patterned by etching in fluorine plasma (hereinafter referred to as "F plasma") using a mask layer #2 (not illustrated). Then, the protective photoresist is removed in oxygen plasma. The patterning step forms a "tuning layer" 46 or a "first $SiO_2$ layer". The tuning layer 46 is shown in FIG. 15b, and may have the various exemplary thicknesses shown in FIG. 23 depending on the type of wafer used.

As a next step, $SiO_2$ (e.g., PECVD $SiO_2$) is deposited over the tuning layer 46 and selected portions of the substrate to form a second $SiO_2$ layer 48 having a thickness of, by example, 400 nm. It should be noted that for the purposes of providing a clear description, tuning layer 46 and layer 48 of $SiO_2$ are collectively referred to as the "$SiO_2$ layer 4''''" in the remaining portion of this description of the fabrication process. Also, these layers are collectively labelled by the numeral "48'" in FIGS. 15c to 19c.

A next step of the process includes sputtering a metallic element such as, by example, Molybdenum (Mo), over the $SiO_2$ layer 48'. The Mo is then patterned by etching in F plasma using a mask layer #3 to form a first layer portion of a bottom electrode (hereinafter referred to as a "first bottom electrode portion") 50. The patterning step is performed so that a side 50b of the first bottom electrode portion 50 is horizontally separated from a corner edge 48a of a top surface of layer 48' by a distance of about 20 µm. This can be appreciated in view of FIG. 17d which illustrates various dimensions of a cross-section B—B of the resonator structure. The $SiO_2$ layer 48' located outside of the perimeter of the first bottom electrode portion 50 may also be etched as needed. The first bottom electrode portion 50 may also be covered by, for example, a thin gold film (not illustrated).

Referring to Pigs. 16a–16c, a next step includes sputtering ZnO at high temperature over the first bottom electrode portion 50 and over a selected portion of layer 48'. By using a mask layer #4, the ZnO is then patterned by wet etching to form a second ZnO layer 52 (i.e., a piezoelectric layer) having a thickness of, by example, 2060 nm. The patterning step is preferably performed in a manner so that a top surface of the second ZnO layer 52 has a width of, by example, 400 µm. This can be appreciated in view of FIG. 16c which illustrates a cross-section B—B of the resonator. Also, the patterning step is preferably performed in a manner such that a bottom surface of the second ZnO layer 52 has edges which are spaced apart from other components of the resonator by particular distances. By example, and referring to FIG. 16c, an edge 52b of the second ZnO layer 52 is formed to be horizontally separated from corner edge 48a of the $SiO_2$ layer 48' by a distance of approximately 40 µm. Also by example, and referring again to FIG. 17d, an edge 52b of the second ZnO layer 52 is formed to be horizontally separated from side 50b of the first bottom electrode portion layer 50 by a distance of about 20 µm. Also, side 50b of the first bottom electrode portion layer 50 is horizontally separated from a corner edge 48b of the $SiO_2$ layer 48' by a distance of about 25 µm.

A next step of the process includes depositing $SiO_2$ (e.g., PECVD $SiO_2$) over selected portions of the second ZnO layer 52, over selected portions of the $SiO_2$ layer 48', and over selected portions of the first bottom electrode portion 50. Thereafter, AlN is deposited over the newly deposited $SiO_2$ layer for an etch stop layer. Using a mask level #5 (oxide passivation), the newly deposited AlN and $SiO_2$ are then patterned by a wet etching in F plasma to provide an AlN layer 56 (see dark shaded line) and third $SiO_2$ layer 54 respectively, as are shown in FIGS. 17a–17d. The third $SiO_2$ layer has a thickness of, by example, 300 nm. The AlN layer 56 has a thickness of, by example, 50 nm. It should be noted that only slight over-etching is performed in order to ensure that the first bottom electrode portion 50 is not damaged. The result of the patterning step leaves a portion 52a of a top surface of the second ZnO layer 52 and a portion 50a (FIG. 17a) of a top surface of the first bottom electrode portion 50 exposed to air. Also, the patterning step removes portions of the layers 54 and 56, leaving portions of the top surface of the SiO$_2$ layer 48' exposed to the air. By example, and referring to FIGS. 17d, the patterning step creates side surfaces 54a and 54b formed by the layers 54 and 56. The side surfaces 54a and 54b are horizontally separated from each other by a distance of about 30 μm. As such, openings A' and B' (also referred to as "etch windows") are formed in the structure on opposite sides of the piezoelectric layer 52, leaving portions of the top surface of layer 48' exposed to air.

Figure 16A:
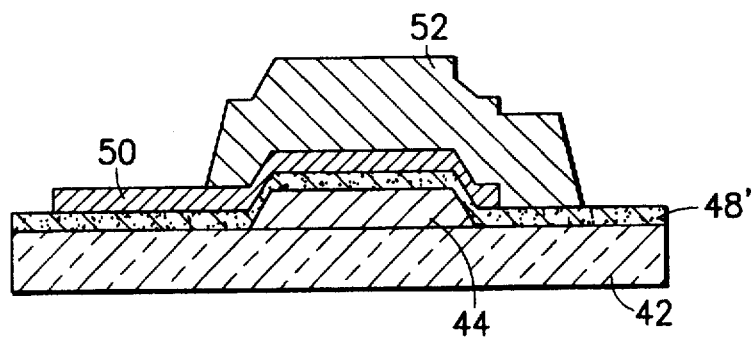
FIG. 16a illustrates a cross-section A—A of the BAW resonator of FIG. 15a as it appears after a further step of the fabrication process of the invention.
Figure 16B:
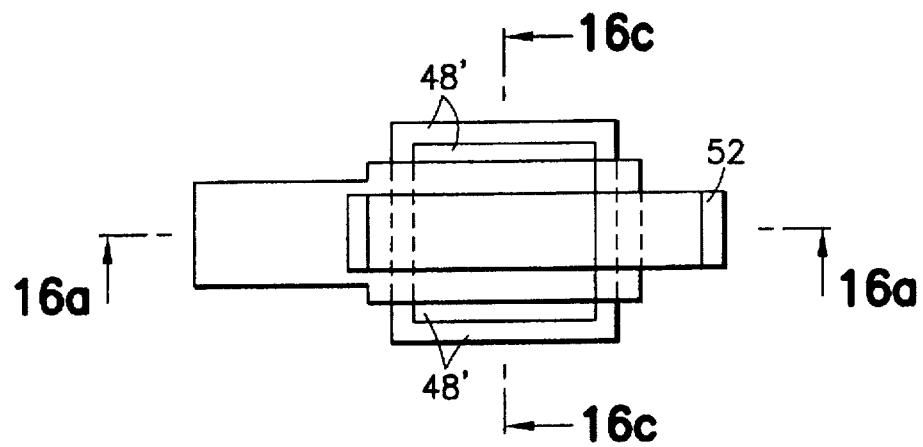
Figure 16C:
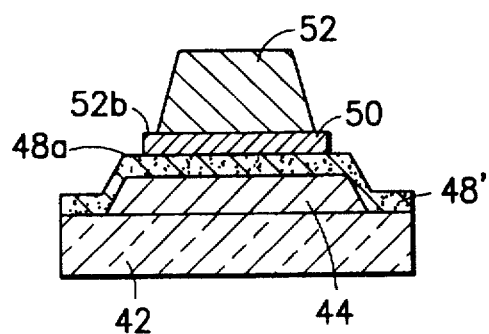

It should be noted that the dimensions illustrated in FIGS. 16c and 17d are intended to be exemplary dimensions of the resonator structure, and are not intended to be limiting of the invention's scope. Although the dimensions are shown for only the portion of the resonator shown in FIG. 17d, these dimension are intended to be representative of other similar portions of the resonator which are not shown in FIG. 17d.

Figure 18A:
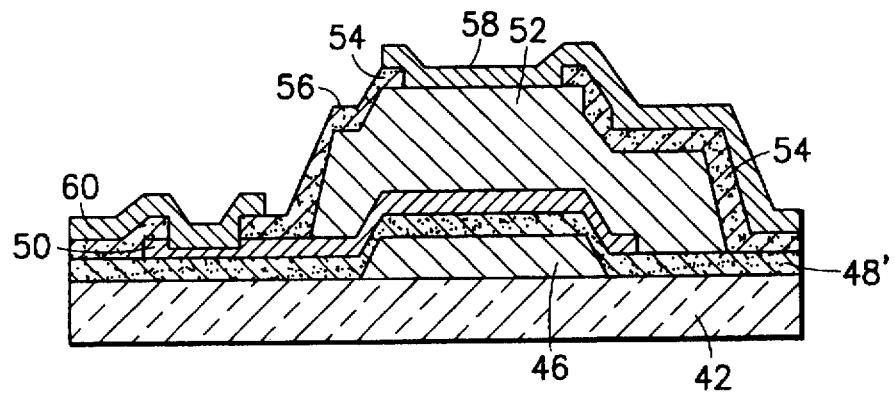
FIG. 18a illustrates a cross section A—A of the BAW resonator of FIG. 17a as it appears after a further step of the fabrication process of the invention.
Figure 18B:
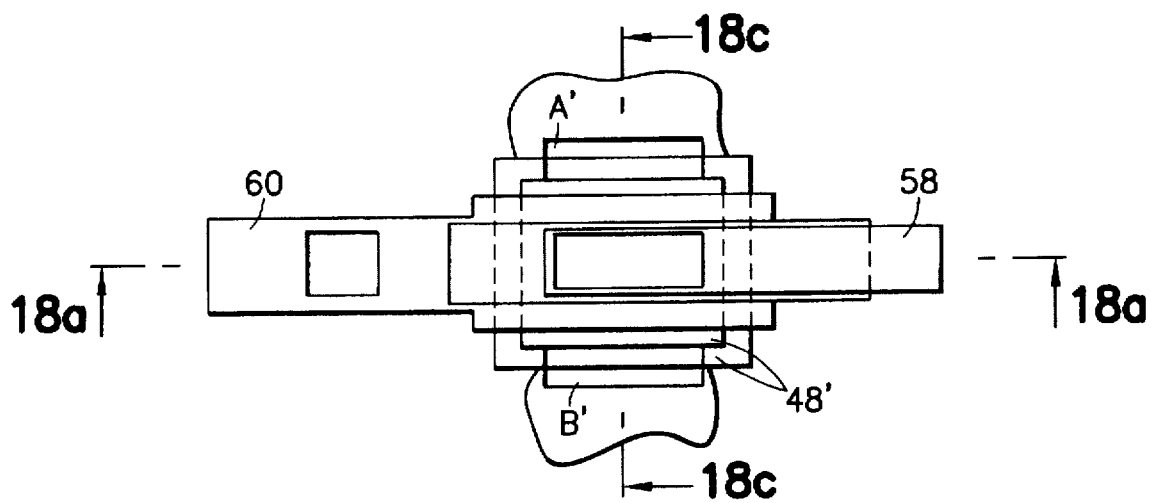
Figure 18C:
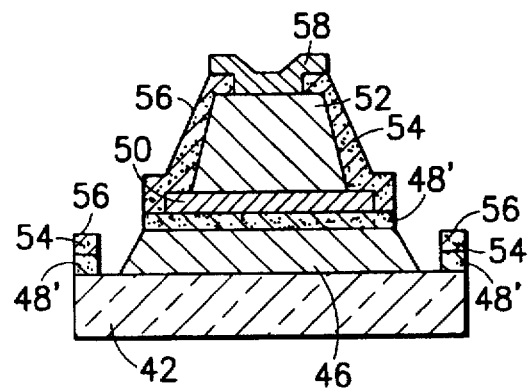
Figure 19A:
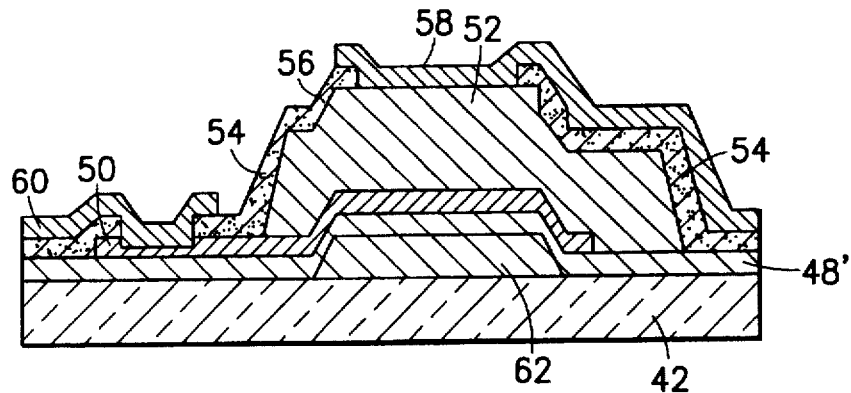
FIG. 19a illustrates a cross-section A—A of the BAW resonator of FIG. 18a as it appears after a further step of the fabrication process of the invention.
Figure 19B:
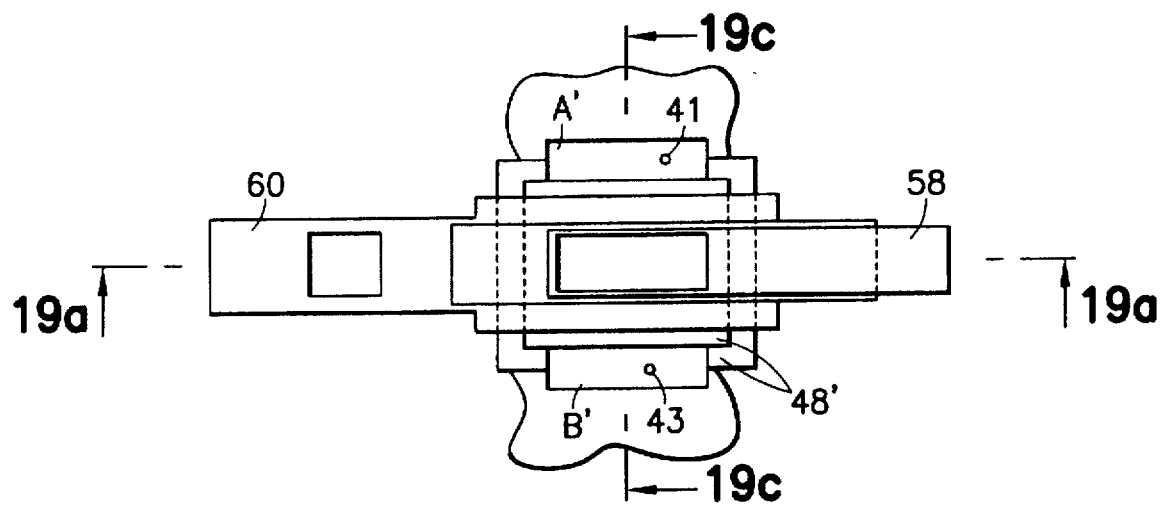
Figure 19C:
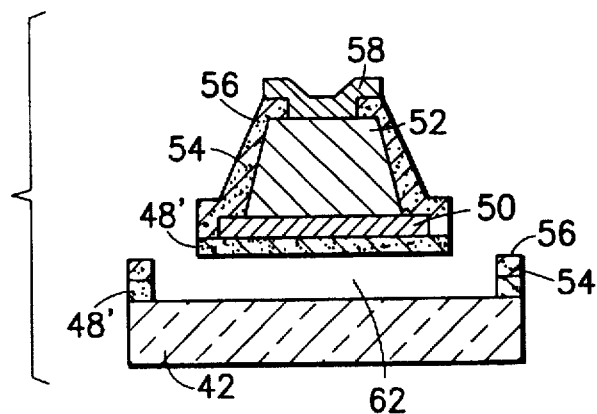

Referring to FIGS. 18a–18c, further steps of the fabrication process may be understood. A top electrode 58 and a second layer portion of the bottom electrode (hereinafter referred to as a "second bottom electrode portion) 60 are formed by: (a) sputtering molybdenum (Mo) over selected portions of the second ZnO layer 52, over selected portions of the AlN layer 56, and over selected portions of the first bottom electrode portion 50, and (b) patterning the sputtered Mo by etching in F plasma, using a mask level #6 (not illustrated). The top electrode 58 and the second bottom electrode portion have thicknesses of, by example, 300 nm. Thereafter, selected portions of the SiO$_2$ layer 48' covering the cushion edges of the first ZnO layer 46 (e.g., cushion edges 44a and 44b) are removed by deep etching. The third SiO$_2$ layer 54 remains protected by the AlN layer 56. The protective photoresist is then removed in oxygen plasma. A next step includes spinning on a protective photoresist and patterning it by etching with a mask #7 (not illustrated) to form vias 41 and 43 (FIG. 19b).

Dicing grooves are then formed by sawing between chips or wafers as needed, and thereafter the photoresist is removed in, by example acetone. Also, referring to FIGS. 19a–19c, the first (cushion) ZnO layer 46 is removed by etching through openings A' and B' in dilute HAc+H$_3$PO$_4$ to form air gap 62. After these steps of the fabrication process are completed, the performance characteristics of the resonator may then be tested with testing devices. Also, some of the Molybdenum may be removed as needed from the top electrode 58 and the second bottom electrode portion 60 by etching in F plasma. Once these steps have been completed, the wafer may be chipped by breaking along the grooves.

Figure 6:
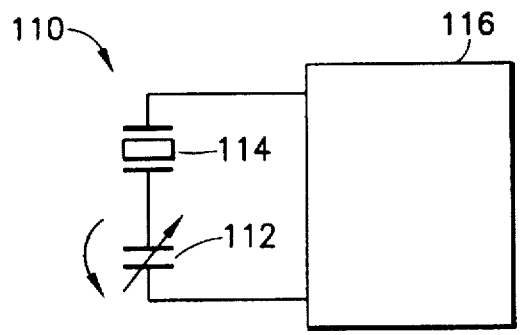
FIG. 6 illustrates a prior art embodiment of a voltage controlled oscillator incorporating a resonator, a variable voltage capacitor, and an active device.
Figure 8:
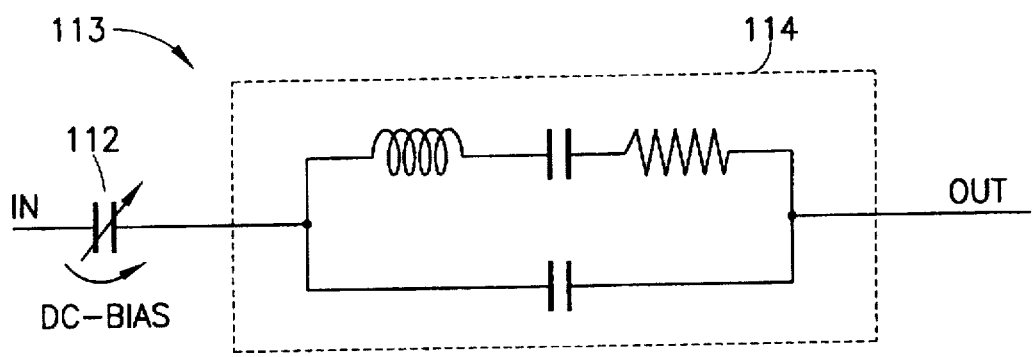
FIG. 8 illustrates an equivalent circuit of a prior art embodiment of a tunable resonator which is connected in series with a tunable capacitor.

A further aspect of the invention will now be described. Resonators included in circuits comprising voltage dependent elements such as, by example, capacitors, are known to exhibit either parallel or series resonant frequencies which vary in frequency when the voltage dependent elements are DC-biased. Examples of two such circuits are illustrated in FIGS. 6 and 8. FIG. 6, for example, shows a circuit 110 including a capacitor 112 which is connected in series with a resonator 114 and an active device 116. In FIG. 8, a circuit 113 includes a capacitor 112 connected in series with an equivalent circuit of a resonator 114. When the DC-biases of the variable voltage capacitors 112 of these circuits 110 and 113 are varied, the value of the series connected capacitance of the capacitors 112 is changed. As a result, series resonant frequencies exhibited by these circuits become shifted. The resonators 114, however, remain unbiased and the equivalent circuit elements (i.e., series inductor, series capacitor, series resistor, and parallel capacitor) of the resonators 114 have constant values. As such, it can be appreciated that the changes in the resonant frequencies of the circuits occur primarily as a result of the DC-bias of the variable voltage capacitors 112 only.

The series resonant frequency of circuit 113 may be defined as:

$$Fs=1/(2*Pi\sqrt{(Ls*Ctot)}), \text{ where:}$$

Ls represents the equivalent circuit series inductor of resonator 114; Ctot represents the combined capacitance of the equivalent circuit series capacitor (Cs) of resonator 114 and the capacitor ("Ctun") 112; and Ctot=Cs*Ctun/(Cs+Ctun).

At frequencies that are below the series resonant frequency of the resonator 114, the resonator 114 acts like a capacitor. At frequencies that are above the series resonant frequency of the resonator 114, the resonator behaves like an inductor. Accordingly, it may be appreciated that the series resonant frequencies of the circuits 110 and 113 can be shifted to above, and not below, the characteristic resonant frequency of the resonator 114. These frequencies are limited to the parallel resonant frequency of the resonator 114.

Figure 9:
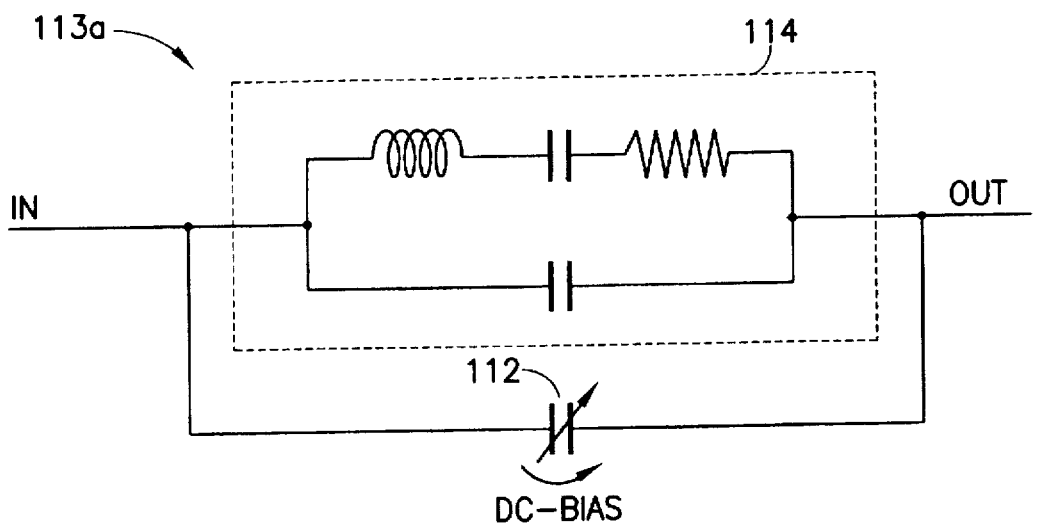
FIG. 9 illustrates an equivalent circuit of a prior art embodiment of a tunable resonator which is connected in parallel with a tunable capacitor.

An example of a circuit comprising a resonator connected in parallel with a capacitor is shown in FIG. 9. Referring to FIG. 9, a circuit 113a is shown which includes an equivalent circuit of a resonator 114 connected in parallel with a capacitor 112. The resonator 114 of this circuit 113a exhibits a shift of its parallel resonant frequency in response to a DC-biasing of the capacitor 112 and a resultant voltage being applied across the resonator 114. The shift causes the resonator 114 to have a different parallel resonant frequency than the resonator 114 yields without the applied voltage.

The parallel resonant frequencies of circuit 113a can only be tuned to frequencies that are lower than the characteristic parallel resonant frequency of the resonator 114. The lower limit of such frequencies is the series resonant frequency of the resonator 114.

For the purposes of this description, BAW resonators having series and parallel resonant frequencies which shift in response to an applied voltage are referred to as "tunable resonators".

The BAW resonators of the instant invention exhibit shifts in their parallel and series resonant frequencies, and in their impedances in response to DC-bias voltages being applied across the resonators. This occurs in the following manner. When a bias voltage is applied to the electrodes of one of the resonators, an electric field having a magnitude that is a function of the bias voltage is created within the piezoelectric material located between the electrodes. The electric field causes the piezoelectric material to expand or compress depending upon the polarity of the bias voltage. As a result, the piezoelectric material exhibits a particular mechanical resonant frequency, a particular impedance, and particular parallel and series resonant frequencies which are different than those exhibited by the piezoelectric material without the effect of the applied DC-bias voltage. As such, for a case in which the DC-bias voltage is supplied from a time-dependent, variable voltage source, the application of the varying bias voltage to the resonator causes the electric field to vary as a function of the varying voltage. As a result thereof, the piezoelectric material is caused to resonate at varying frequencies that are a function of time and the varying voltage, and to exhibit varying impedances that are a function of the varying voltage. The bias voltage also may have some effect on parameters that are associated with the piezoelectric material. These parameters can also influence the resonant frequencies.

Also, as a result of the varying DC-bias voltage, the BAW resonators of the instant invention exhibit a maximum phase shift response at particular frequencies which vary as a function of the varying bias voltage.

Figure 7:
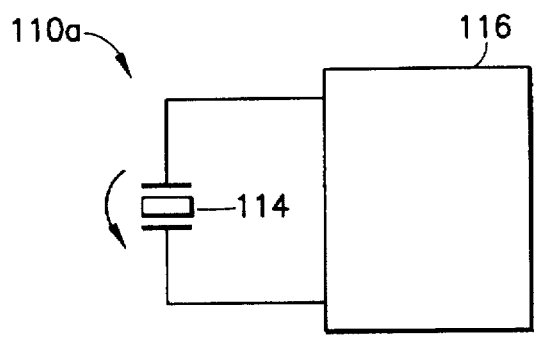
FIG. 7 illustrates a voltage controlled oscillator comprising a resonator and an active device.
Figure 10:
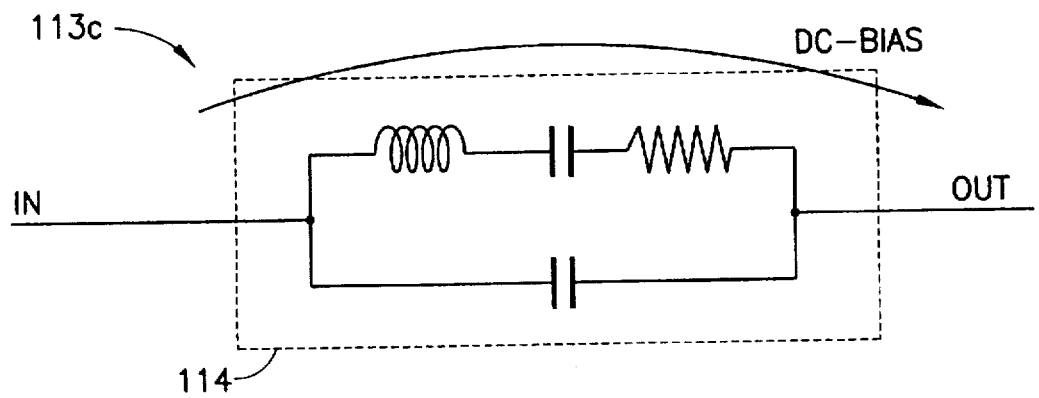
FIG. 10 illustrates an equivalent circuit of a tunable resonator.
Figure 11:
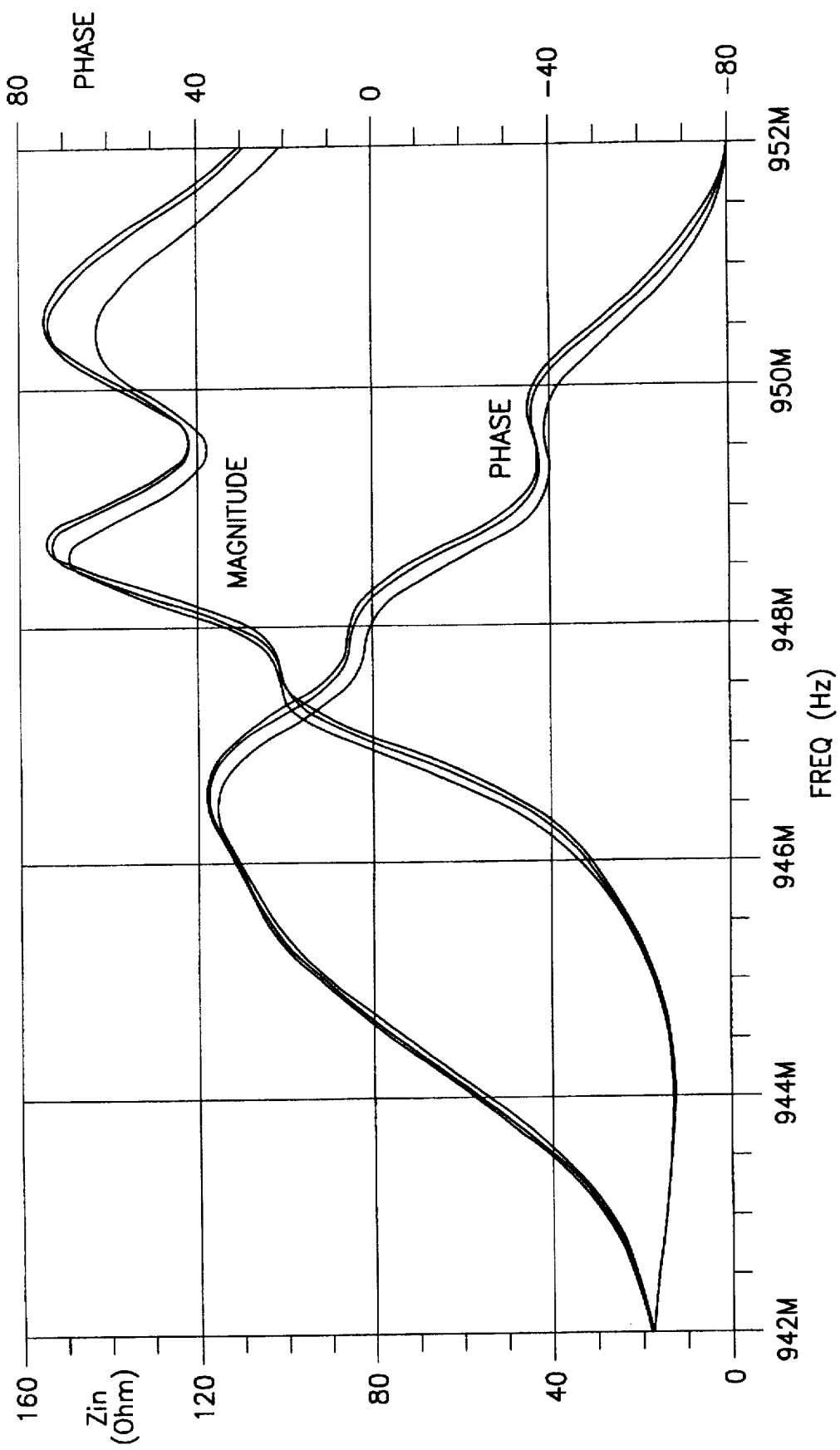
FIG. 11 illustrates phase and amplitude curves of a one port BAW resonator in response to an application of bias voltages of −28 volts, 0 volts, and +28 volts.
Figure 12A:
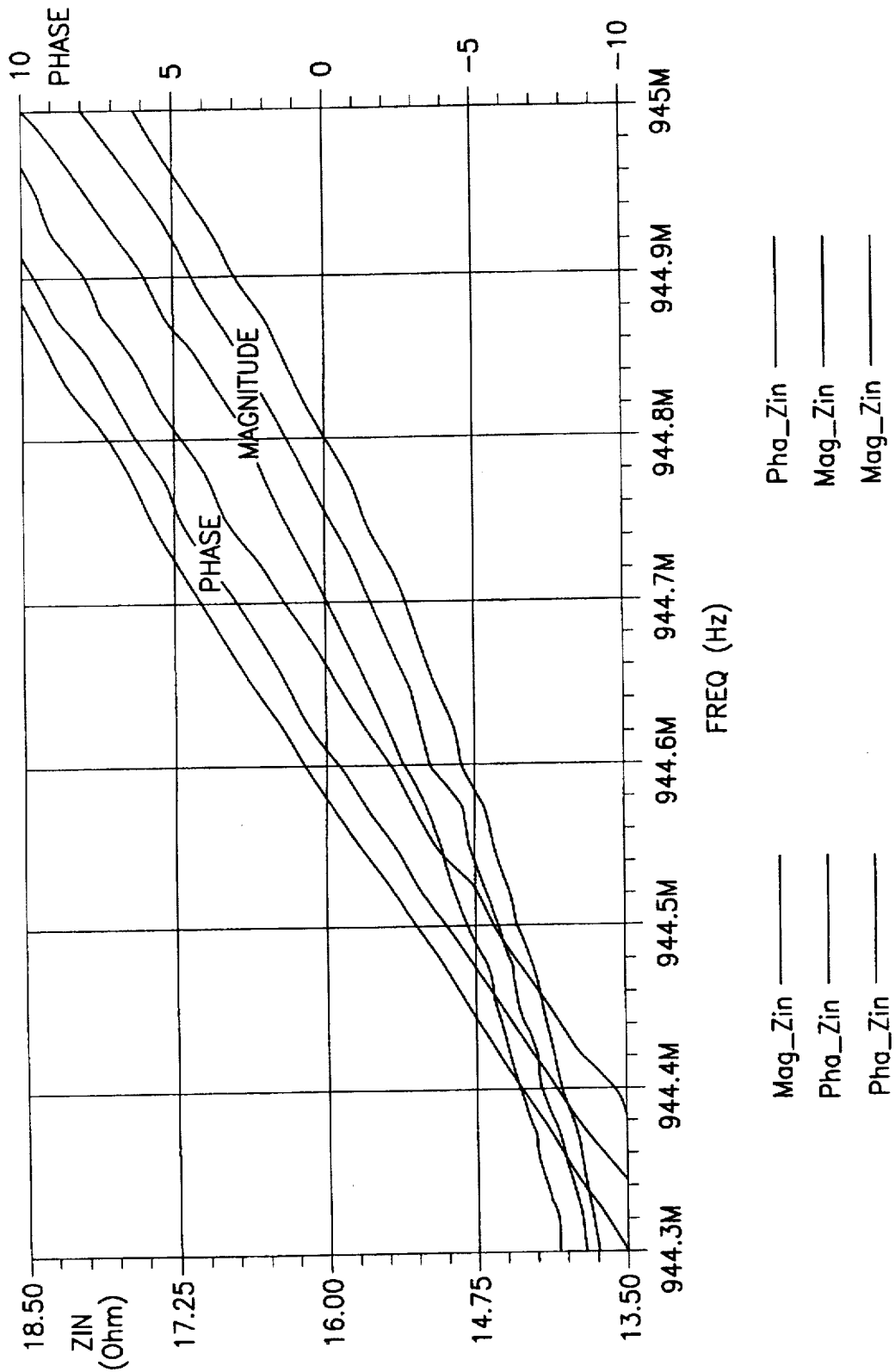
FIG. 12a illustrates a portion of the curves of FIG. 11, showing in particular the portion of the curves where the series resonance of the BAW resonator occurs.
Figure 12B:
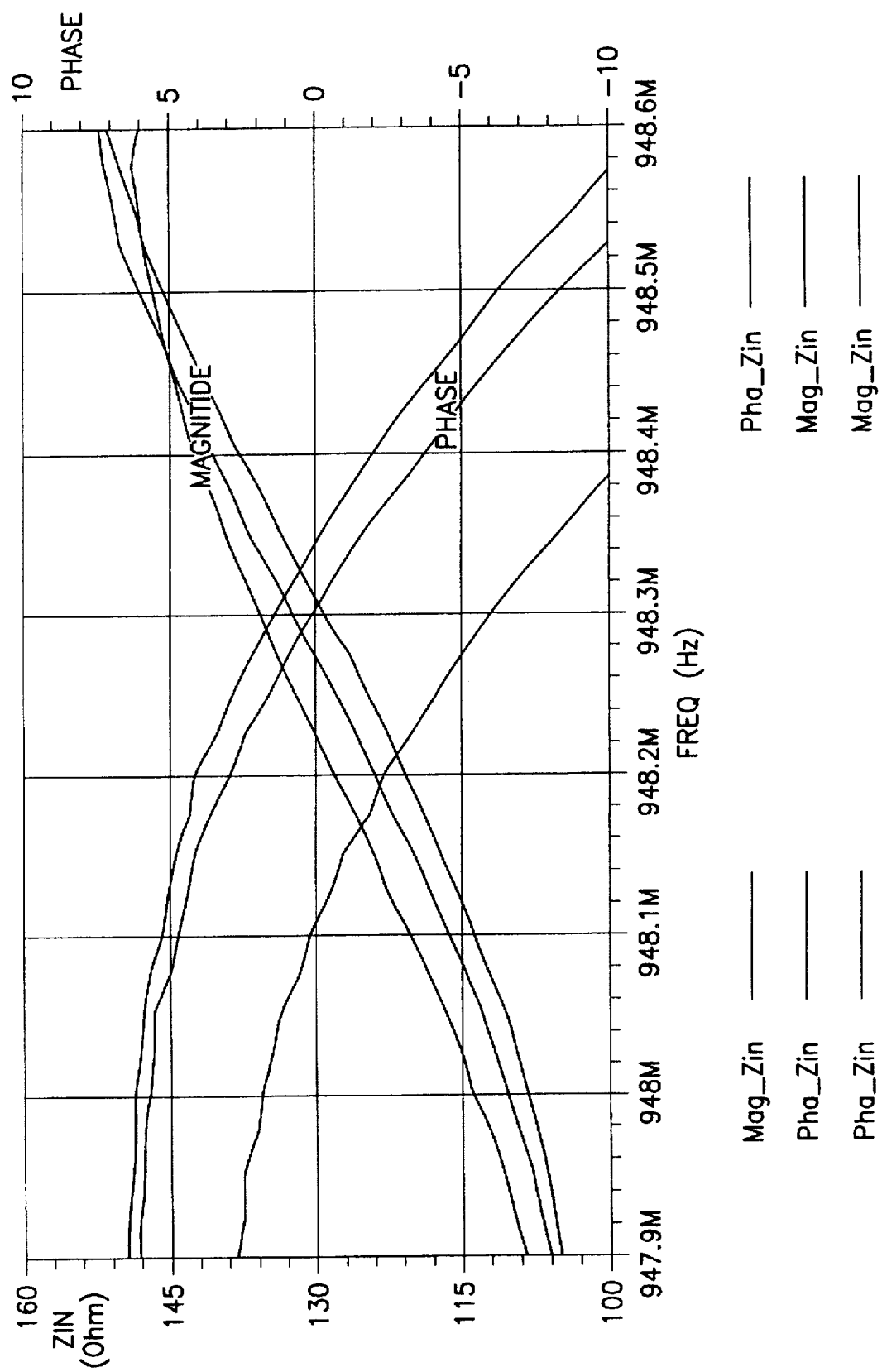
FIG. 12b illustrates shows a portion of the curves of FIG. 11, showing a portion of the curves where the parallel resonance of the resonator occurs.

The impedance, gain, and phase "shifting" characteristics exhibited by the BAW resonators may be appreciated in view of the circuits illustrated in FIGS. 7 and 10, and also in view of FIGS. 11, 12a, and 12b. By example, FIG. 7 illustrates a circuit 110a including a resonator 114 which exhibits shifts in its impedance and parallel and series resonant frequencies, and which also exhibits a maximum phase shift response at a particular frequency in response to an applied bias voltage. Similarly, FIG. 10 illustrates a circuit 113c which includes an equivalent circuit of a resonator (e.g., a BAW resonator) 114 which exhibits similar characteristics. FIG. 11 illustrates a diagram showing measured phase and amplitude curves of an exemplary one port BAW resonator in response to applied bias voltages of −28 volts, 0 volts, and +28. The frequencies range from 942 MHz to 952 MHz. FIG. 12a illustrates a portion of the curves of FIG. 11, showing, in particular, the portion of the curves where the series resonance of the BAW resonator occurs. FIG. 12b also shows a similar diagram for the portion of the curves where the parallel resonance of the resonator occurs.

The tunable BAW resonators of the invention may be utilized in various applications. By example, one or more of the resonators may be employed as a voltage dependent feedback element for a voltage controlled oscillator, or as a frequency controlling element in integrated oscillators. One or more of the BAW resonators may also be utilized to create a filter having a tunable center frequency (e.g., for dual mode applications). For this application, a bandpass filter may be synthesized with the resonators. The resonators utilized in this application permit the filter to have an approximately fixed bandwidth since the parallel and series resonant frequencies of the resonators are separated by a substantially constant bandwidth. Moreover, because the BAW resonators are fully integratable devices, the filter and voltage controlled oscillator applications in which the resonators may be employed can be small in size.

In addition to these applications, the inventor has determined that when a frequency signal (e.g., in the KHz to MHz range) signal is applied to a BAW resonator, the resonator may be utilized to amplitude modulate or phase modulate higher frequency RF carrier signals of interest. This can be appreciated in view of FIG. 1a, which illustrates a device, namely a circuit 91 incorporating a BAW resonator 102 for one of amplitude modulating on phase modulating an RF carrier signal. Within the circuit 91, the resonator 102 is connected in parallel with two circuit branches. A first one of the branches comprises a generator 90 for generating an RF carrier signal, a bandpass filter 92, and a low frequency blocking capacitor 94. The second branch comprises a generator 96 for generating a modulating low frequency signal, a low pass filter 98, and an RF-choke 100. The resonator 102 may be any known type of resonator, including by example, one of the resonators illustrated in FIGS. 2a, 3, and 5.

In an exemplary application in which the circuit 91 is being employed to amplitude modulate an RF signal, the circuit 91 operates in the following manner. Generator 96 generates a modulating low frequency signal which varies within a predetermined voltage range (e.g., between −30 volts, 0 volts, and +30 volts) over a specified time period. After the low frequency signal is produced, it is filtered by lowpass filter 98, and is thereafter applied to the RF-choke 100 which blocks RF signals. The RF-choke 100 then provides the low frequency signal to the remaining portion of circuit 91 comprising resonator 102.

As the low frequency signal passes through the remaining portion of circuit 91, the resonator 102 has a voltage applied across its electrodes 102a and 102b as a result of the signal. The voltage creates an electric field within piezoelectric material 102c between the electrodes 102a and 102b of the resonator 102. The electric field magnitude varies as a function of the time-varying voltage applied to the resonator 102 in response to the low frequency signal. The electric field effects the piezoelectric material 102c in a manner similar to that described above, causing it to vibrate, which causes a frequency shift of the resonator's series and parallel resonant frequencies and a shift of the resonator's impedance. The amounts by which the respective series and parallel resonances and the impedance are shifted are a function of the voltage variation of the low frequency signal and of the electric field variation. The bandwidth bounded by the parallel and series resonant frequencies remains substantially constant during the frequency shifts.

The generator 90 generates an RF carrier signal having a frequency that is between the series and parallel resonant frequencies exhibited by the resonator 102 in response to the applied modulating low frequency signal. Preferably, the generated RF carrier signal has a frequency which is within a frequency range in which the resonator exhibits a minimum phase shift in response to the applied modulating low frequency signal. By example, for a resonator having a frequency response such as the one shown in FIG. 13b, which will be described below in more detail, a minimum phase shift occurs at approximately 963 MHz. Similarly, for a resonator having a frequency response as that illustrated in FIG. 13d, which also will be described below, a minimum phase shift occurs at approximately 978 MHz. Thus, ideal carrier signal frequencies for these cases are approximately 963 MHz and 978 MHz, respectively.

After the RF carrier signal is generated by generator 90, it is filtered by the bandpass filter 92, and is then applied to low frequency blocking capacitor 94 which blocks any attendant low frequency signals. Thereafter, the RF carrier signal is supplied to the remaining portion of the circuit 91 comprising the resonator 102.

The shifting of the impedance and of the series and parallel resonant frequencies exhibited by the resonator 102 in response to the modulating low frequency signal cause a portion of the RF carrier signal traversing the circuit 91 between node 95 and output node 96 to pass through resonator 102. The amount of this portion of the RF carrier signal depends upon the varying impedances and resonant frequencies exhibited by the resonator 102. As a result, the strength of the RF carrier signal travelling between node 95 and output node 96 is attenuated by time-varying amounts which are a function of the voltage variation of the low frequency signal (i.e., the signal experiences a time-dependent, varying amount of insertion loss), thus resulting in an amplitude modulation of the carrier signal. By example, in an exemplary case wherein a resonator having a frequency response such as that of FIG. 13b is employed for performing an amplitude modulation of a 963 MHz carrier signal via a 600 kHz modulating signal having voltages varying between −V, 0V and +V, the carrier signal experiences a time-varying insertion loss of approximately ±2 dB (see discussion of FIG. 13b below).

Circuit 93 illustrated in FIG. 1b shows another embodiment of a circuit for performing amplitude modulation. This circuit 93 comprises similar elements to those of circuit 91, except that resonator 102' is series-connected within the circuit 93, and a coil 104 is shown connected to ground. Similar to the operation of circuit 91, the generator 96 generates a low frequency modulating signal and generator 90 generates an RF carrier signal having a frequency that is between the series and parallel resonant frequencies of the resonator 102'. The low frequency signal is then applied to elements 98 and 100, and the RF carrier signal is applied to elements 92 and 94, which perform in the same manner as described above. The low frequency signal is then applied to resonator 102' which, in response thereto, experiences an electric field between electrodes 102a' and 102b' within piezoelectric material 102c'. The electric field causes an impedance shift and a shift of the series and parallel resonant frequencies of the resonator 102' as a function of the voltage variation of the low frequency signal, in a similar manner as described above. As such, after the RF carrier signal traverses circuit 93 from nodes 95 to resonator 102' and is applied to the resonator 102', the signal then experiences a varying, time-dependent attenuation, and becomes an amplitude modulated signal. The amplitude modulated signal is then supplied to output node 96. The low frequency signal is directed to a low frequency ground via coil 104.

As described above, the circuit 91 of FIG. 1a may also be employed to phase modulate a carrier signal of interest. For this application, the circuit 91 is operated in a manner similar to that described above, except that the generator 90 generates a carrier signal having a frequency that is preferably approximately equal to the parallel resonant frequency of the shunt-connected resonator 102. This is the frequency of which the resonator 102 resonates and yields its maximum phase shift response as a result of the modulating low frequency signal being applied to the resonator 102. As such, an application of a signal having this frequency to the resonator 102 results in a phase shift occurring to the signal by an amount which is a function of the modulating low frequency signal voltage variation. By example, for an exemplary case in which the resonator 102 has frequency response curves like those shown in FIG. 13b, and wherein the low frequency signal applied to the resonator 102 has a voltage which varies between −V, 0V, and +V, a phase shift of approximately ±28 degrees occurs to a carrier signal having a frequency of approximately 977.5 MHz.

Circuit 93 of FIG. 1b may also be employed to phase modulate a carrier signal of interest. For this application, the circuit 93 is operated in a manner similar to that described above except that generator 90 generates a carrier signal having a frequency that is preferably approximately equal to the series resonant frequency of the series-connected resonator 102'. This is the frequency of which the resonator 102' resonates and yields its maximum phase shift response as a result of the effect of the low frequency signal on the resonator 102'. As such, an application of the carrier signal to resonator 102' causes a phase shift to occur to the signal by an amount which is a function of the modulating low frequency signal voltage variation. The phase shifted carrier signal is then supplied to output node 96, and the low frequency signal is directed to a low frequency ground via coil 104.

It should be noted that whether circuit 91 or circuit 93 is best suited for a particular application depends upon the impedances of the elements forming the respective circuits. By example, the shunt connected resonator configuration (FIG. 1a) performs most effectively for a high impedance circuit.

The BAW resonators of this invention can perform amplitude or phase modulation to RF carrier signals having frequencies in the range from approximately 500 MHz to at least 3 GHZ, and can operate at an RF power level which is at least ±30 dBm. Moreover, the resonators can perform these modulations in response to low frequency modulating signals having voltages of at least ±30 volts and frequencies within the KHz to MHz range. Also, at least a 5% amplitude modulation of a carrier signal has been observed in an application employing a ±28 volt, 600 KHz modulating low frequency signal. However, at least a 30% amplitude modulation of an RF carrier signal is achievable. The invention can also phase shift a carrier signal by at least one degree per volt of the modulating low frequency signal.

FIGS. 13a–13d illustrate frequency responses for various exemplary BAW resonators connected either in series or in parallel, and having two ports of specified impedances. For each Figure, the three gain response curves represent the amplitude versus frequency responses to negative, zero, and positive bias voltages, respectively. Similarly, the three phase response curves represent the phase versus frequency responses to negative, zero, and positive bias voltages, respectively. Ideal carrier signal frequencies for achieving amplitude modulation and phase modulation for the particular resonators are also indicated.

Figure 13A:
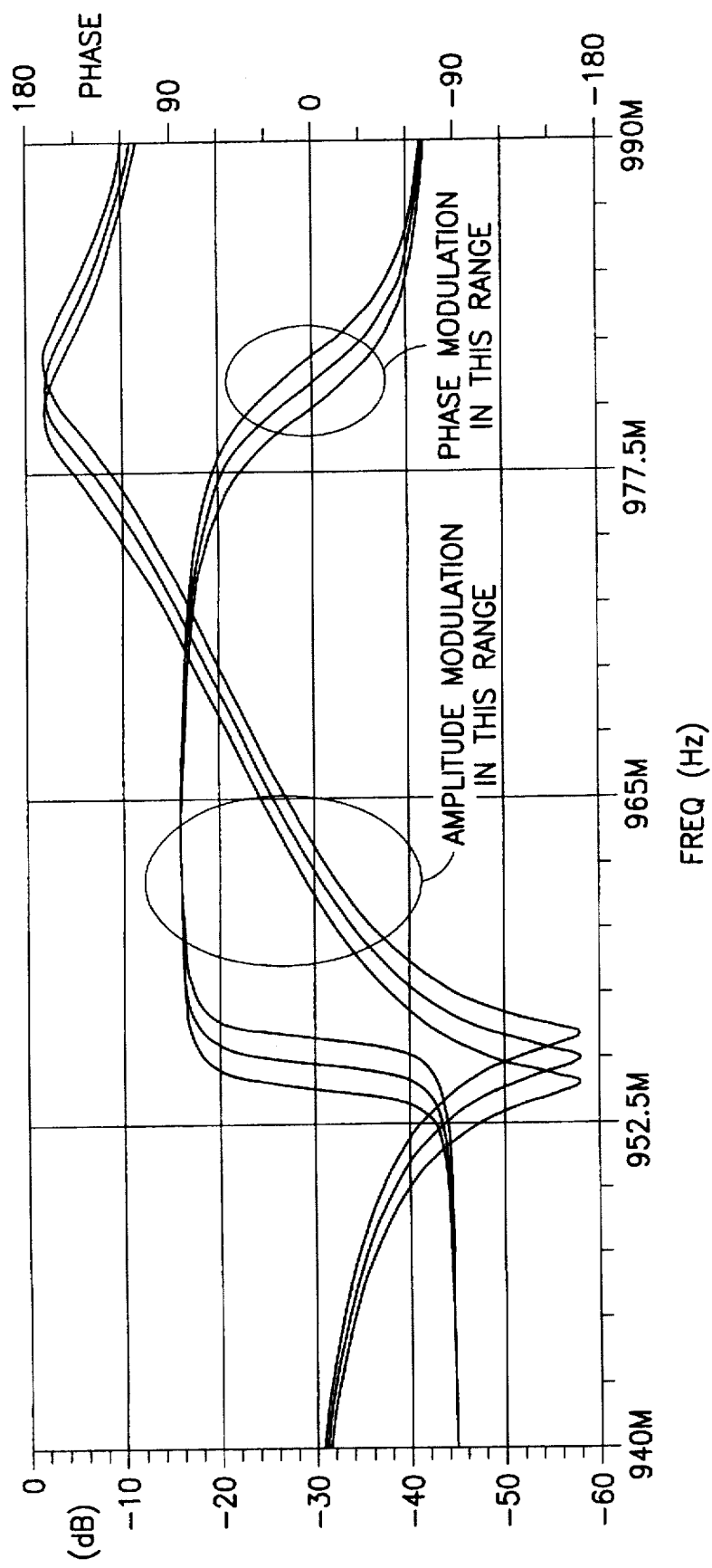
FIG. 13a shows a frequency response of a two port BAW resonator which is connected in parallel.
Figure 13B:
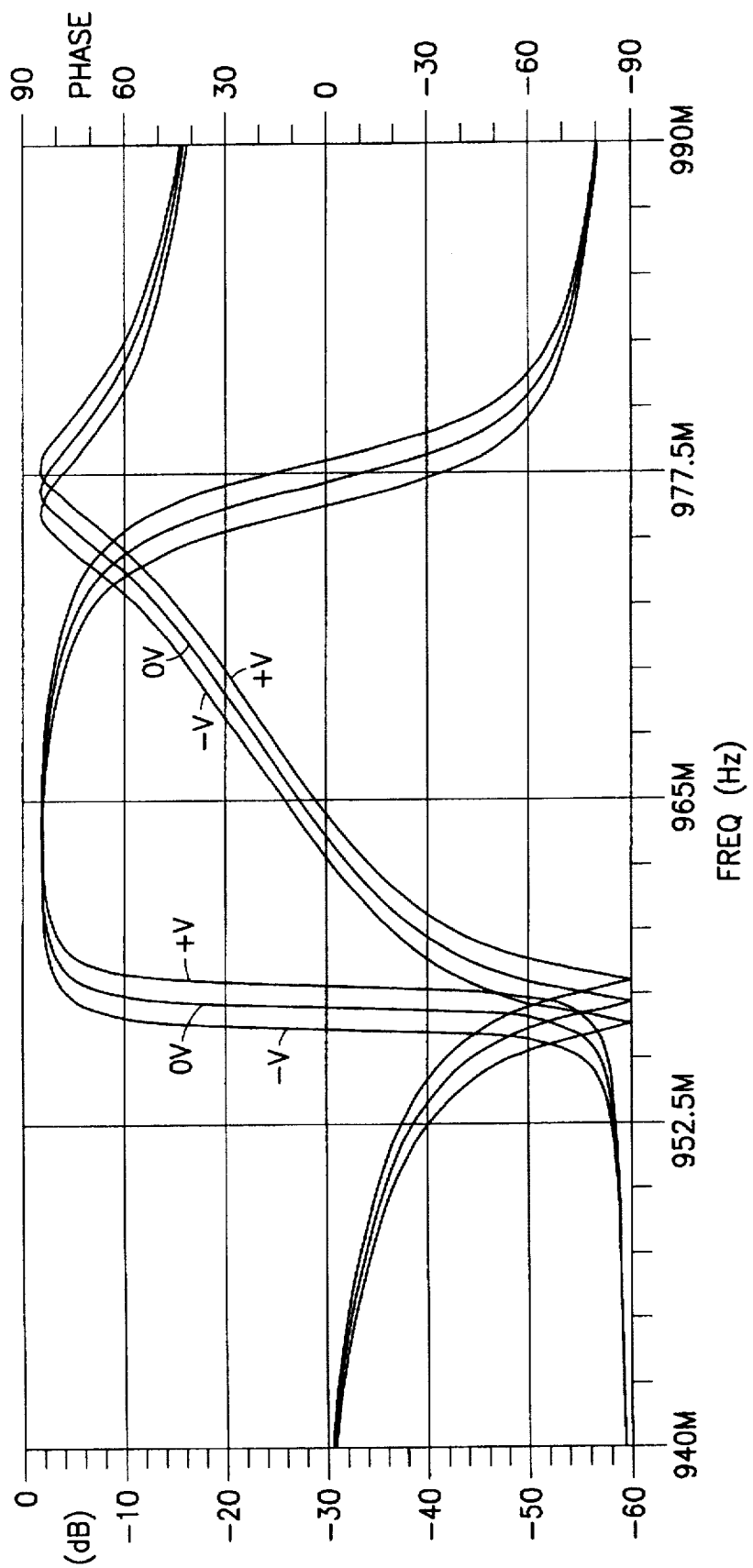
FIG. 13b illustrates a frequency response of a two port BAW resonator which is connected in parallel.

Referring to FIG. 13a, frequency response curves of an exemplary two port BAW resonator which is shunt-connected are illustrated. The ports have high impedances of 1 kOhm. For this example, the resonator has a layer of ZnO that is 2060 nm thick, a layer of $SiO_2$ that is 400 nm thick, and lateral dimensions of 330 µm×330 µm.

FIG. 13b illustrates a frequency response of a two port BAW resonator which is shunt-connected. The ports have high impedances (e.g., 1 kOhm). For this example, the resonator has a layer of ZnO that is 1650 µm thick, a layer of $SiO_2$ that is 1140 nm thick, and lateral dimensions of 330 µm×330 µm. Also, as described above, the application of a low frequency (e.g., 600 kHz) signal to the resonator causes a time-varying insertion loss of approximately ±2 dB to be experienced by a 963 MHz carrier signal.

Figure 13C:
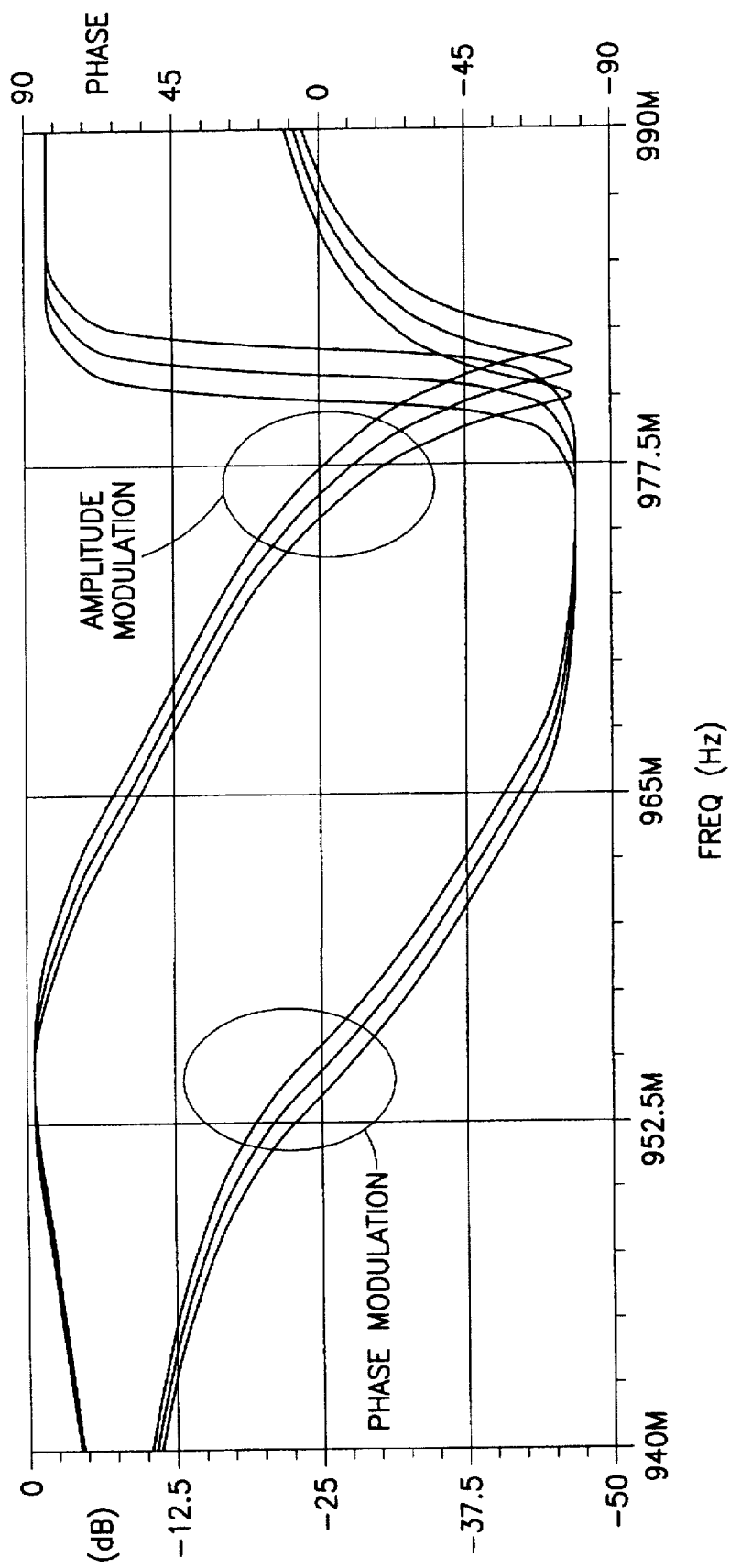
FIG. 13c illustrates a frequency response of a two port series-connected BAW resonator.

FIG. 13c illustrates a frequency response of a two port BAW resonator which is series-connected. The ports have low impedances (e.g., 20 Ohm). For this example, the resonator has an area of 170 µm×170 µm, and has a high impedance.

Figure 13D:
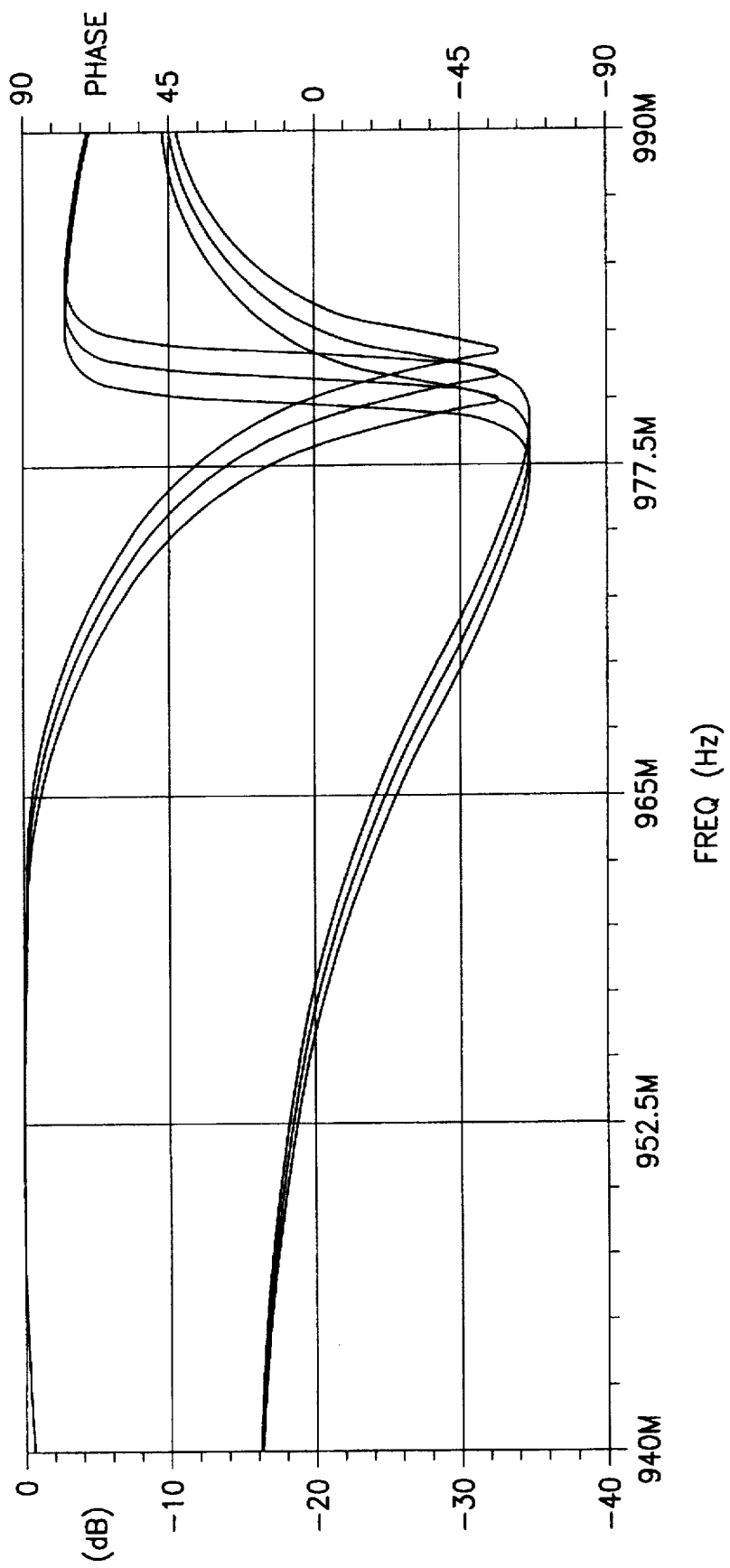
FIG. 13d illustrates a frequency response of a two port series-connected BAW resonator.

FIG. 13d illustrates a frequency response of an exemplary two port BAW resonator which is series-connected. The ports have low impedances (e.g., 50 Ohm). For this example, the resonator has an area of 232 µm×232 µm, corresponding to an impedance of approximately 50 Ohms. Also, for this example, an application of a low frequency (e.g., 600 KHz) signal to the resonator causes a time dependent insertion loss of approximately ±3 dB to be experienced by a carrier signal having a frequency of 978 MHz.

Figure 14A:
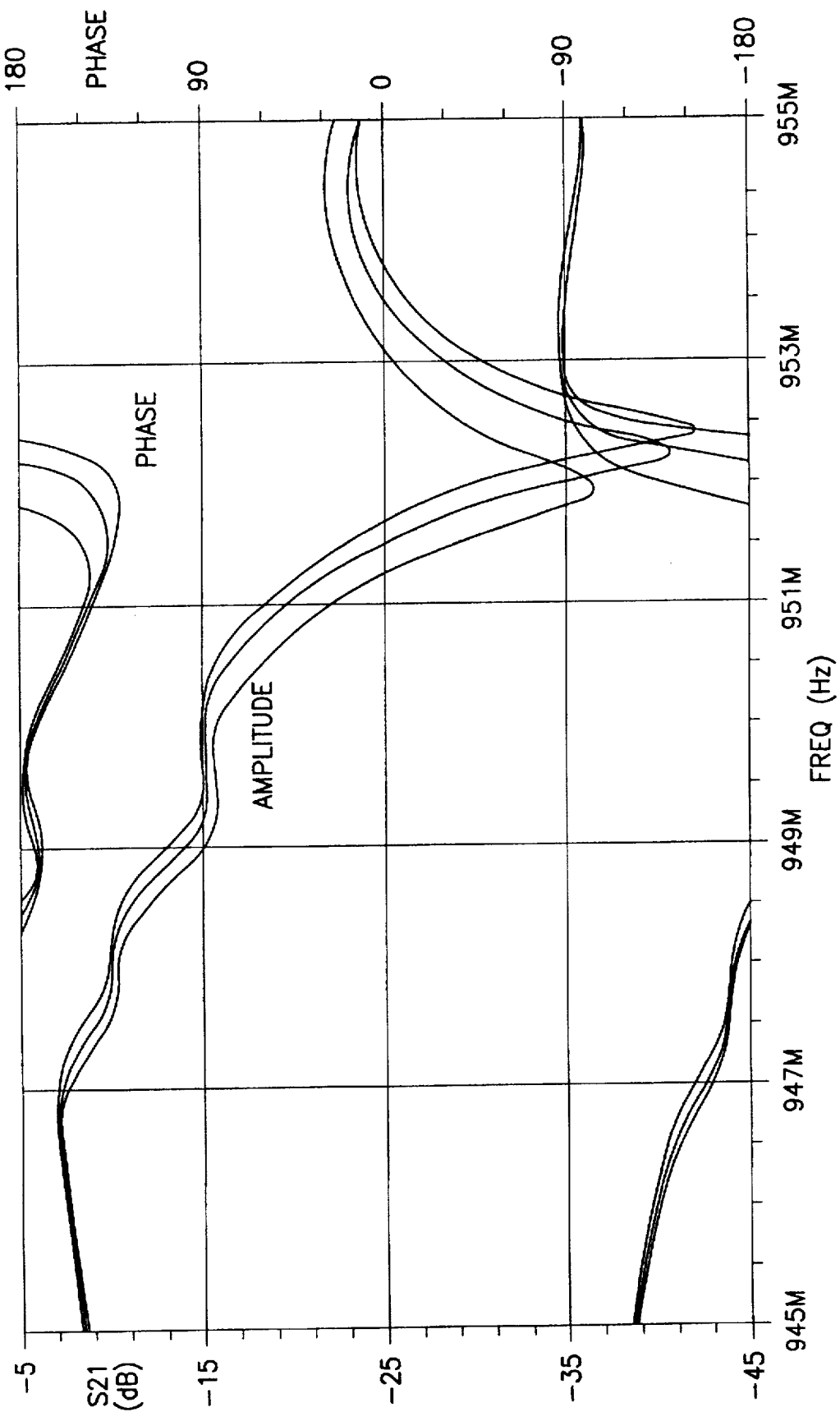
FIG. 14a illustrates a frequency response of a series-connected resonator in response to applied DC-bias voltages of +28V, 0V, and −28V.
Figure 14B:
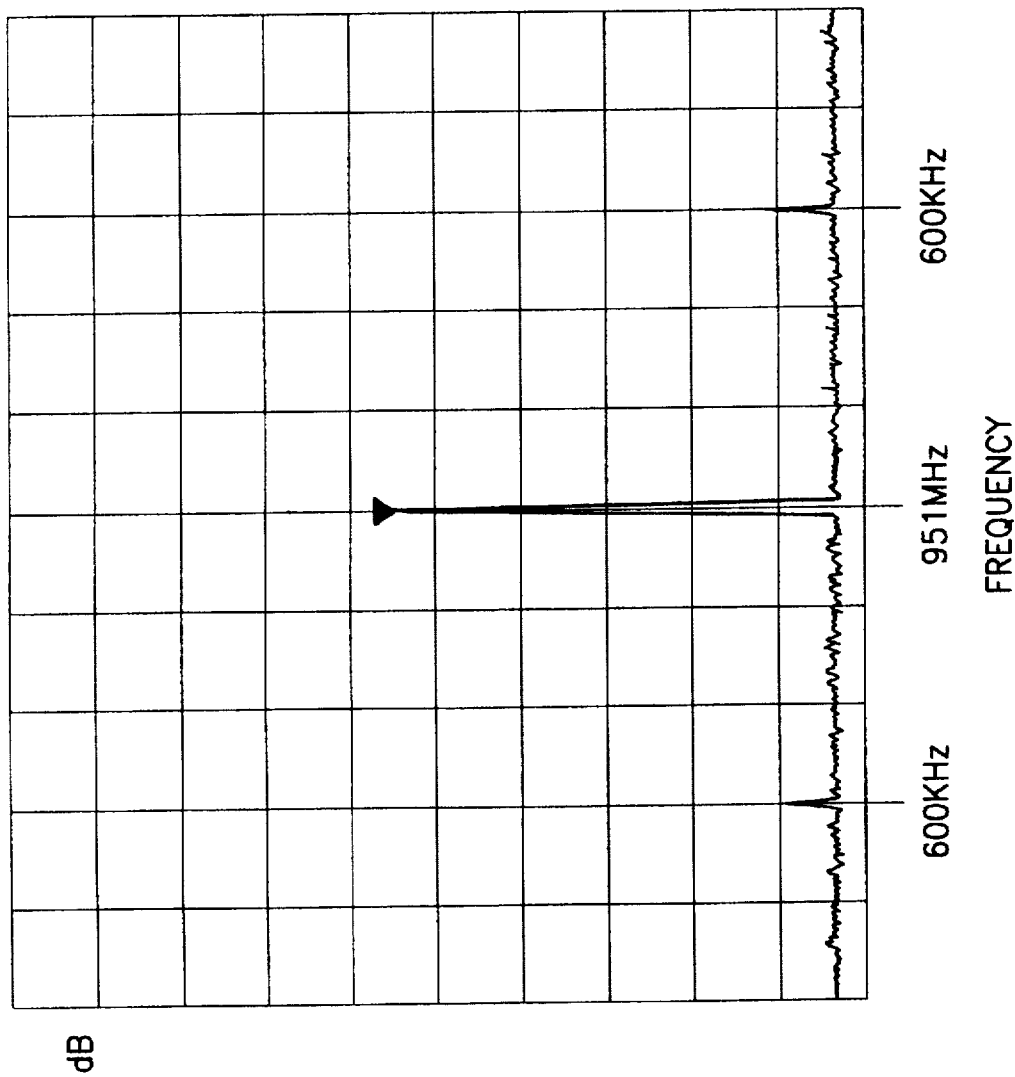
FIG. 14b illustrates a measured spectrum of the resonator of FIG. 14a in response to an RF carrier signal having a frequency of 951 MHz and a low frequency modulating signal having a frequency of 600 KHz and an amplitude of 8 Vpp.

FIG. 14a illustrates a frequency response of a series-connected resonator in response to an applied DC-bias voltage of +28V, 0V, and −28V. FIG. 14b illustrates a measured gain response of the resonator in response to an RF carrier signal having a frequency of 951 MHz and a low frequency modulating signal having a frequency of 600 KHz and an amplitude of 8 Vpp. Sideband spikes occur at 600 kHz as shown in FIG. 14b.

While the invention has been particularly shown and described with respect to preferred embodiments thereof, it will be understood by those skilled in the art that changes in form and details may be made therein without departing from the scope and spirit of the invention.

What is claimed is:

1. A Bulk Acoustic Wave (BAW) resonator comprising:

a substrate;

resonating means;

a first electrode situated adjacent to a first surface of said resonating means;

a second electrode situated adjacent to a second surface of said resonating means;

a membrane situated between said second electrode and said substrate; and a pair of etch windows; and an air gap separating at least a portion of said substrate from at least a portion of said membrane, said air gap being formed by removing a portion of said substrate through said etch windows;

wherein said resonating means resonates in response to an electric field produced between said first and second electrodes as a result of a voltage that is applied therebetween, and wherein said air gap isolates vibrations produced by said resonating means from said substrate.

2. A Bulk Acoustic Wave resonator as set forth in claim 1, wherein said membrane comprises a first layer and a second layer.

3. A Bulk Acoustic Wave resonator as set forth in claim 2, wherein said first layer comprises at least one of poly-silicon (poly-si) and aluminum nitride (AlN), and wherein said second layer comprises at least one of silicon dioxide ($SiO_2$) and gallium arsenide (GaAs).

4. A Bulk Acoustic Wave resonator as set forth in claim 1, wherein said first and second electrodes are comprised of gold (Au).

5. A Bulk Acoustic Wave resonator as set forth in claim 1, wherein said resonating means comprises at least one of zinc-oxide (ZnO) and aluminum nitride (AlN).

6. A Bulk Acoustic Wave resonator as set forth in claim 1, wherein said substrate comprises at least one of silicon (Si), silicon dioxide ($SiO_2$), gallium arsenide (GaAs), glass, and a ceramic material.

7. An amplitude modulator circuit, comprising:

a variable voltage generator for generating a low frequency signal having a time-varying voltage;

a tunable resonator coupled to said variable voltage generator, said tunable resonator exhibiting parallel and series resonances at frequencies which shift as a function of voltage; and means for generating an RF carrier signal having a frequency that is between a parallel resonant frequency and a series resonant frequency exhibited by said tunable resonator in response to a signal output by said variable voltage generator;

wherein, in response to both of a the low frequency signal being output by said variable voltage generator and an RF signal being output by said RF carrier signal generator, said tunable resonator causes the RF carrier signal to be attenuated by amounts that are a function of the time-varying voltage of the modulating low frequency signal, thereby amplitude modulating the RF carrier signal.

8. An amplitude modulator circuit as set forth in claim 7, wherein said resonator is connected within said circuit in one of a parallel configuration and a series configuration.

9. An amplitude modulator circuit as set forth in claim 7, wherein said RF carrier signal generator generates an RF carrier signal having a frequency which is within a range of frequencies over which said tunable resonator yields a minimum phase shift in response to a signal output by said variable voltage generator.

10. A phase modulator circuit, comprising:

a variable voltage signal generator for generating a low frequency signal having a time-varying voltage;

a tunable resonator, said tunable resonator yielding a maximum phase shift at one of a parallel resonant frequency and a series resonator frequency in response to a modulating low frequency signal output by said variable voltage signal generator; and means for generating an RF carrier signal having a frequency that is substantially equal to said one of a parallel resonant frequency and a series resonant frequency;

wherein, in response to both of a modulating low frequency signal being output by said variable voltage signal generator and an RF carrier signal being output by said RF carrier signal generator, said tunable resonator causes the RF carrier signal to be phase shifted by an amount that is a function of a variation of the modulating low frequency signal voltage, thereby forming a phase-modulated signal.

11. A phase modulator circuit as set forth in claim 10, wherein said RF carrier signal generator generates a signal having a frequency that is substantially equal to said parallel resonant frequency for a case in which said resonator is connected within said tunable circuit in a parallel configuration, and wherein said RF carrier signal generator generates a signal having said series resonant frequency for a case in which said tunable resonator is connected within said circuit in a series configuration.

12. A method for amplitude modulating a signal, comprising the steps of:

applying a modulating low frequency signal having a time-varying voltage to a tunable resonator, the tunable resonator exhibiting parallel and series resonances at frequencies which shift by amounts that are a function of the time-varying voltage; and applying an RF carrier signal having a frequency that is between the parallel resonant frequency and the series resonant frequency to the tunable resonator, wherein in response thereto, the tunable resonator causes the RF carrier signal to be attenuated as a function of the time-varying voltage of the modulating low frequency signal, thereby amplitude modulating said RF carrier signal.

13. A method as set forth in claim 12, wherein the RF carrier signal has a frequency which is approximately equal to one of which the resonator yields a minimum phase shift in response to the modulating low frequency signal.

14. A method for phase modulating a signal, comprising the steps of:

applying a modulating low frequency signal having a time-varying voltage to a tunable resonator, the tunable resonator yielding a maximum phase shift at one of a parallel resonant frequency and a series resonant frequency in response to the modulating low frequency signal, wherein the amount of phase shift yielded is a function of a variation of the voltage of the modulating low frequency signal; and applying an RF carrier signal having a frequency that is substantially equal to said one of a parallel resonant frequency and a series resonant frequency, wherein in response thereto, the tunable resonator phase shifts the RF carrier signal by the amount of phase shift yielded by the tunable resonator, thereby phase modulating said RF carrier signal.

15. A method as set forth in claim 14, wherein the RF carrier signal has a frequency that is substantially equal to said series resonant frequency for a case in which the tunable resonator is connected in series, and wherein the RF carrier signal has a frequency that is substantially equal to said parallel resonant frequency for a case in which the tunable resonator is connected in parallel.

* * * * *